United States Patent [19]
Shershen

[11] Patent Number: 5,406,207
[45] Date of Patent: * Apr. 11, 1995

[54] ELECTRICAL CONTINUITY TESTER COMBINED WITH FLASHLIGHT AND/OR LANTERN

[76] Inventor: Eugene D. Shershen, 1002 - 475 Elgin Street, Ottawa, Ontario, Canada, K2P 2E6

[*] Notice: The portion of the term of this patent subsequent to Nov. 16, 2010 has been disclaimed.

[21] Appl. No.: 153,131

[22] Filed: Nov. 15, 1993

Related U.S. Application Data

[63] Continuation-in-part of Ser. No. 935,529, Aug. 25, 1992, Pat. No. 5,262,728.

[51] Int. Cl.$^6$ .................................................. G01R 31/02
[52] U.S. Cl. ............................................. 324/506; 324/507; 362/204
[58] Field of Search ............... 324/506, 507, 550, 556; 439/290, 500, 621, 622, 912; 362/191, 204; 340/638

[56] References Cited

U.S. PATENT DOCUMENTS

| | | | |
|---|---|---|---|
| 2,550,234 | 4/1951 | Ducan | 324/506 |
| 3,711,768 | 1/1973 | Frazin | 324/507 |
| 3,873,915 | 3/1975 | Hayes | 324/506 |
| 4,250,446 | 2/1981 | Ponte | 324/506 |
| 5,262,728 | 11/1993 | Shershen | 324/506 |

FOREIGN PATENT DOCUMENTS

| | | | |
|---|---|---|---|
| 2248467 | 5/1975 | France | 324/507 |
| 2480440 | 10/1981 | France | 324/507 |

Primary Examiner—Maura K. Regan
Attorney, Agent, or Firm—Weingram & Zall

[57] ABSTRACT

An improved testing structure is provided in a flashlight (or lantern) provided with an electrical continuity tester. The flashlight or lantern has an insulated body and a flashlight (or lantern) bulb and batteries in primary series circuit. The testing structure, which is formed in the flashlight (or lantern) body, includes a testing series circuit, which is electrically-coupled to the primary series circuit, and a testing site. The testing site includes a pair of converging, sloping, facing walls, separated by a floor, the floor being provided with a pair of spaced-apart channels. Two electrically-conductive strips of specifically-defined structure and orientation are provided within the testing site to repose within the pair of spaced-apart channels. The strips may be resiliently urged into coincident relationship with the walls of the channels. The side of the testing site, the angle of convergence of the walls, and the spacing of the spaced-apart channels are selected so as to allow the contact portions of the strips, which follow the contours and slopes of the sloping walls, to act as guideways to guide terminals of a circuit element being tested into suitable electrical contact. The testing site may be provided with a slidable short-circuiting-preventing member.

22 Claims, 8 Drawing Sheets

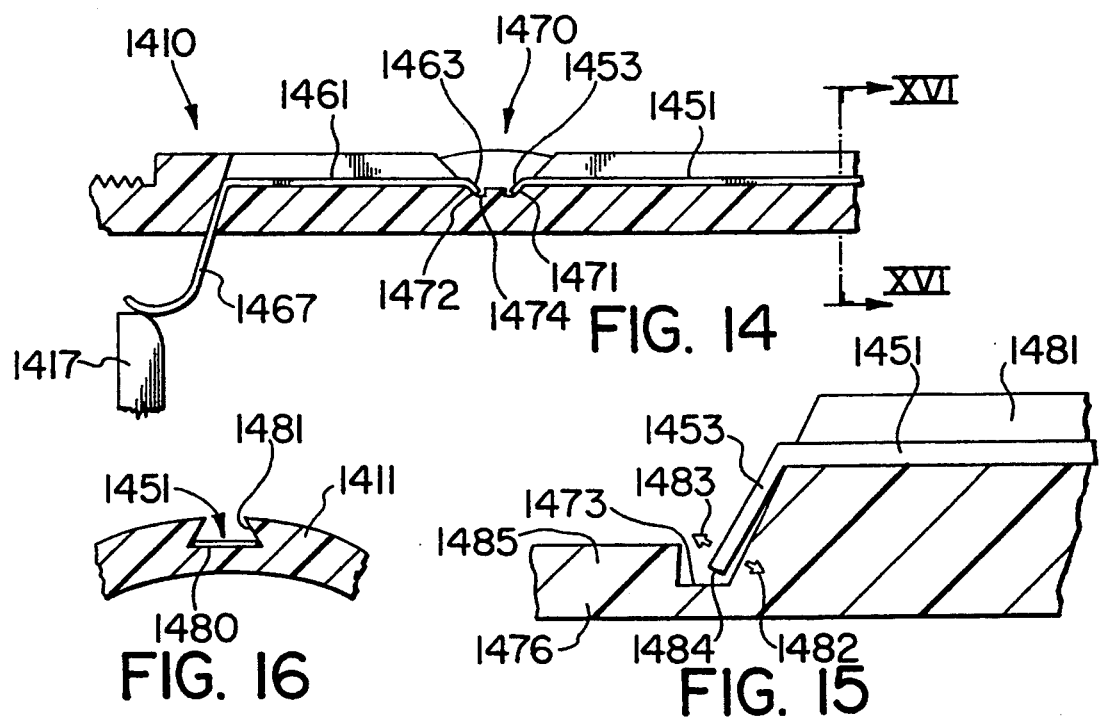
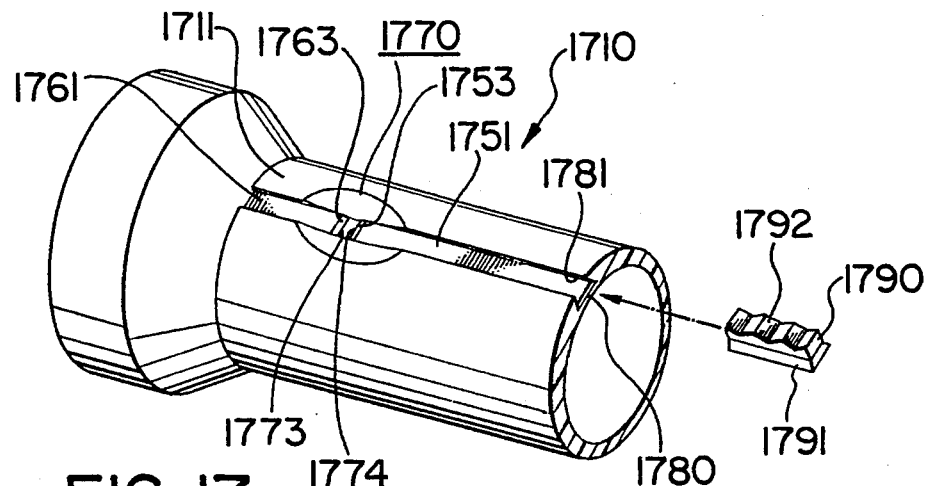
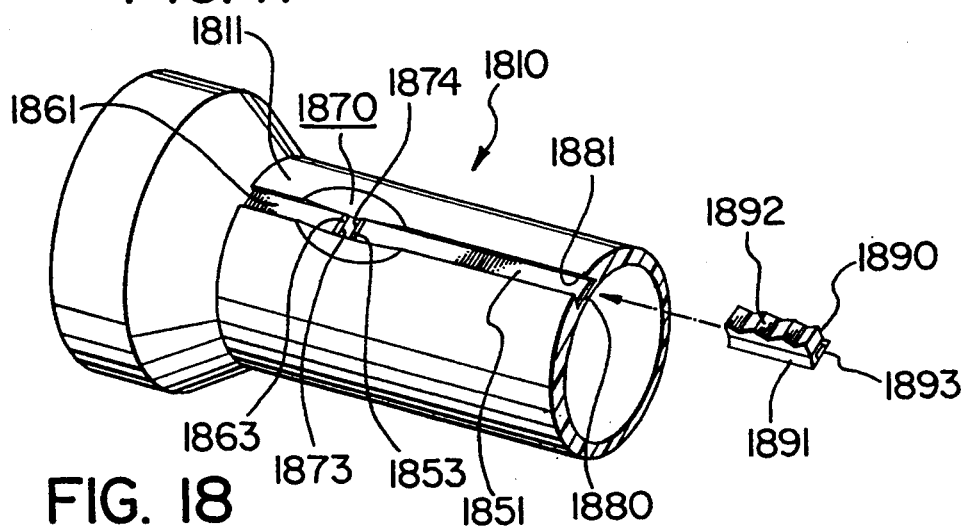

ELECTRICAL CONTINUITY TESTER COMBINED WITH FLASHLIGHT AND/OR LANTERN

RELATED INVENTION

This application is a continuation-in-part of application Ser. No. 07/935,529, filed Aug. 25, 1992, now U.S. Pat. No. 5,262,728, the entire contents of which are incorporated herein by reference.

BACKGROUND OF THE INVENTION

1. Field of the Invention

The present invention relates to an electrical continuity tester which is combined with a flashlight (and/or lantern), and particularly to a continuity tester which is an integral part of a flashlight (and/or lantern).

2. Description of the Prior Art

It is frequently necessary to test the continuity of fuses and light bulbs. Normally, there is no convenient means for effecting such continuity tests. As a consequence, the practice has previously been simply to replace fuses with new fuses thought to be in proper working order. The same situation also obtains with light bulbs.

The more popular commercial flashlights are, broadly speaking, of two types, one using an insulating tube for the batteries and a distinct electrical circuit, and the other using the flashlight enclosure proper as a part of the electrical circuit. Plastic or hard rubber encased flashlights, a variation of the first type above, are also available. The present invention was conceived as the combination of a continuity tester with a flashlight. In such unit, the need for light, as well as a continuity testing apparatus is met. Also, a flashlight provides a convenient and portable source of electrical current and a lamp which can be used as a continuity light.

There are many patents relating to combined flashlights and continuity testers, but many of these require a separate attachment to the end of the flashlight. Canadian Patent No. 230,864, patented May 8, 1923 by F. J. Schmidt, provided one such device in the form of a testing attachment for flashlights. It included a shell adapted for attachment to a flashlight. A flexible cord unit was removably-connected to the flashlight and was in electrical connection with the flashlight circuit. The unit was provided with testing terminals at the ends for engagement with the object to be tested.

Canadian Patent No 245,259, patented Dec. 16, 1924 by A. James et al, provided an electric testing device, which included a casing, a lamp bulb, and an accompanying electric battery arranged in the casing. A separate testing lamp was arranged in the casing. Conductors were electrically connected to the testing lamp and were adapted to engage with the outside circuit to be tested.

Canadian Patent No. 283,674 patented Oct. 2, 1928 by L. T. Hook provided such a device in the form which was in combination with an electric flashlight having a detachable base, a sleeve secured[to the base, and a collar slidably-mounted thereover having an interiorly threaded section. A spring was adapted to force the collar into contact with the negative pole of a battery in the flashlight. A member was provided having a base portion carrying an upstanding section. A spindle, terminating at one end in a head and at the other end in an exteriorly threaded section, extended through the member and was insulated therefrom. The upstanding section slidably engaged the sleeve and threadedly engaged the collar, The collar could be withdrawn from the contact with the battery and could be replaced by the head. An electric contact member, was contained with the first-named member and was insulated from the spindle. Such electric contact was adapted to provide a positive pole connection with the flashlight. An insulated casing was secured to the base portion. Means were secured to the contacts and extended through the casing for establishing an electric circuit through the flashlight and the instrumentalities.

Canadian Patent No. 361,334 patented Oct. 27, 1936 by G. Bowmar, provided such a device for operating and testing the electric circuit of an alarm system. The device included a casing, a lamp positioned within the casing adjacent to one end thereof and a battery within the casing. A switch was operable to complete the electric circuit through the battery and the casing to light the lamp. A plug was adapted for insertion in a socket in the electric circuit and extended from the other end of the casing. Electro-magnetic means were carried by the casing which, upon energization, was adapted to close the electric circuit through the battery and the casing to the lamp independent of the switch.

Canadian Patent No. 579,716 patented Jul. 21, 1959 by H. H. Hays, provided a flashlight including the usual casing, a light bulb, a battery-applied electric circuit for the bulb, and a switch in the circuit. A socket was provided on the casing, with its inner end in open communication with the interior of the casing, for the reception of a removable plug. A circuit breaker normally was positioned across the inner end of the socket and completely closed the passage between the socket and casing. The circuit breaker normally engaged and grounded to the inner end of the socket and was operable by a plug inserted in the socket to break such normal grounding of the circuit, which was then grounded through the plug to the side wall of the socket.

Canadian Patent No. 640,778 patented May 8, 1962 by D. B. Pasquale, provided a portable flashlight and testing device including a substantially cylindrical metal casing, a flashlight lamp socket, lamp, casing-insulated conductor member for the socket adjacent to one end of the casing, and a battery. A fixed, elongated conductor strip was connected to the conductor member at one end and extended to the other end of the casing. The casing terminated in an annular in-turned flange. An auxiliary socket included a metal threaded member, an annular flange on the latter in contact with the in-turned casing flange, and a center contact in the socket connected to the conductor strip. The conductor strip was insulated from the metal threaded member. The center contact extended through the openings formed by the flanges out of contact thereof. Means were provided for fixing the center contact in this position, such means included a portion of the strip.

Canadian Patent No. 1,235,182 patented Apr. 12, 1988 by J. C. Hayes provided a system for continuity testing having a housing, a battery with first and second electrodes in the housing, a first lamp with first and second terminals, first means for switching, and means connecting the first lamp first terminal through the first means for switching to the battery first electrode. A second lamp was also provided with first and second terminals, and was associated with a probe assembly, including a probe. Means connected the probe between the battery second electrode and the second lamp second terminal. A shunt circuit was provided between the first and second terminals of the second lamp. Second means for switching was connected in series with the shunt circuit. First and second leads were provided with respective contacts, the second lead being connected with the first electrode, and the first lead being connected with the first terminal of the second lamp.

U.S. Pat. No. 2,209,119 patented Jul. 23, 1940 by J. Ellsworth provided a testing attachment for a flashlight comprising an elongated tubular part attached to the case of nonconducting material of the flashlight, a part connected to the tubular member and passing through the case and contacting a part on the lamp socket of the flashlight. The tubular member had an elongated slot therein formed with angular end parts. A rod was provided for engaging a part of the device to be tested when the rod was projected, the rod being slidably arranged in the tubular member. A pin was on the rod sliding in the slot and engaged the annular parts for holding the rod in either projected position or in a position within the tubular member. A housing was connected with the rear metal cap of the flashlight. A spring actuated reel was carried in the housing and a metal tape was carried by the reel and passed through a slot in the housing. The tape was adapted to be contacted with another part of the device to be tested.

U.S. Pat. No. 3,753,090 patented Aug. 14, 1973 by H. P. Tomek provided a flashlight adapted to either a normal portable lighting function or to use as a continuity tester. Two electrical conductors, used externally, served as continuity test probes. One of these conductors was electrically-connected through the flashlight bulb to one side of the battery supply. The second conductor was electrically-connected to a second side of the battery supply. Continuity was checked by touching the probes to the circuit to be tested. The bulb glowed when the circuit was continuous.

U.S. Pat. No. 3,775,677 patented Nov. 27, 1973 by D. C. Garrett et al, provided a continuity tester including circuit interruption means coupled in series with the electrical circuit of a flashlight. A pair of continuity testing leads was connected to the interruption means by a plug to which the leads were coupled. A switch-including jack was positioned on the flashlight and was coupled to the interruption means. When the continuity leads were disconnected by removing the plug, the jack switch electrically bypassed the interruption means and the flashlight could be operated in a normal fashion. When the leads were connected by inserting the plug into the jack, the jack switch changed position and the flashlight could be lighted only when electrical continuity existed between the test leads.

Other patents provided such continuity tester devices that did not require such attachments to the end of the flashlight.

Canadian Patent No. 583,58 7 patented Sep. 22, 1959 by J. Chandler et al, provided a flashlight including an electrically conductive casing constituting a ground for a contained battery unit. An electrically-conductive bulb holder was mounted in one end of the casing and was insulated therefrom. An electrical contact was affixed to the bulb holder. Switch means including a longitudinally-slidable, permanently-grounded contact member was flexibly engageable with one face of the affixed contact and was slidable into and out of such engagement. A normally-protruding conductive plunger was mounted in, and was insulated from, the casing opposite the engaging end of the grounded contact member. This was adapted, when depressed, to engage the end of the grounded contact member and to flex it from contact with the affixed contact and thereby to open the switch contacts. An auxiliary contact was carried by the plunger in position to engage the other face of the affixed contact when the plunger was depressed to a position to flex the grounded contact member and open the switch contacts.

Canadian Patent No. 698,328 patented Nov. 24, 1964 by D. Ciardiello, provided such a device in the form of a flashlight having a cylindrical insulated body, a pair of metal-rings at opposite ends of the body, a lamp bulb and batteries in series circuit with the rings. A circuit element testing means included a stud mounted at one end of the body in direct electrical circuit with one of the rings, and an elongated electrical conductor carried by the body and spaced longitudinally from the stud. The conductor was in direct electrical circuit with the other of the rings, so that the lamp bulb was lit when one terminal of the element was in contact with the stud and when another terminal of the element was in contact with the conductor to indicate electrical continuity existed between the terminals of the element. The stud had a head and an undercut portion for engaging a terminal lead of the element around the undercut portion. The conductor was a flat strip disposed on the outside of the body and had further studs mounted thereon and spaced apart along the strip. The conductor was a wire member having a bent end contacting the other ring. The wire member had a notch formed therein for receiving a terminal lead of the element, the member being juxtaposed to the outside of the body. The device also included a clip having spring fingers engaged on the wire member and movable therealong so that elements of different sizes can be tested between the stud and the clip. The other member was formed with a doubly bent portion engaged in an aperture in the body near the stud.

U.S. Pat. No. 1,653,669 patented Dec. 27, 1927 by B. M. Rydzy provided a combined combination flashlight and circuit tester including the combination with a flashlight having a control switch, a metallic casing, and a metallic reflector insulated from the casing and adapted to engage a terminal of the lamp. A contact member was provided having a stem projecting through the casing with a washer on the stem tapering inwardly toward the casing. Insulation was provided between the stem and washer and between the contact and washer. Resilient means was provided at the inner end of the stem engageable with the reflector to form a circuit with the lamp for testing purposes. An insulating shield was fitted over the contact member with its inner portion contacting over the tapering portion of the washer to prevent accidental displacement of the shield.

U.S. Pat. No. 2,128,810 patented Aug. 30, 1938 by C. E. Fortine provided a combined flashlight and tester including the combination with a portable flashlight having a casing, a light circuit, and a switch in the circuit having an operating button slidably mounted on the side of the casing intermediate the ends of the casing. An insulated conductor slidably mounted in the casing and was connected in closed circuit position in the light circuit both in the "on" and in the "off" positions of the switch. An insulated test terminal was connected to the conductor and projected through the button. The test terminal had an uninsulated free end forming a contact exposed exteriorly of the button. The arrangement was such that the lamp circuit was closed when the terminals of an operative lamp or fuse to be tested were brought respectively into contact with the casing and with the contact.

U.S. Pat. No. 2,666,894 patented Jan. 19, 1954 by J. Babernitsh provided a combined fuse tester and flashlight comprising a tubular non-conducting casing, a conductive first collar attached to the outside of the casing at one end, and a second conductive collar attached to the outside of the casing at the other end. An electrically-conductive apertured cap was provided in threaded engagement with the first collar. A flanged conductive socket was seated on the end of the first collar within the cap. A bulb was disposed in the socket with its vitreous end in the aperture in the cap. A straight conductive strip was on the outside of the casing and was electrically connected to, and extended from, the first collar toward the second collar and then through the non-conducting casing and along the inside thereof. An apertured conductive cap was in threaded engagement with the second collar. An annular internal rib in the cap defined a seat, and a spring-pressed conductive contact plate was normally positioned on the seat. A button was attached to the contact plate and extended slidably through the apertured cap. A battery was disposed in the casing with one electrode in contact with a contact of the bulb. An apertured conductive closure plate was positioned inside, and at the end of, the non-conductive casing in contact with the end of the conductive strip and in opposition to the contact plate. A conductive spring was provided with one end in engagement with the other electrode of the battery and the other end extending through the aperture in the closure plate and in electrical contact with the contact plate. The spring normally urged the contact plate into spaced relation to the closure plate, and the button was adapted to move the contact plate into engagement with the closure plate.

U.S. Pat. No. 2,681,433 patented Jun. 15, 1954 by T. S. Palmer, provided a flashlight-type tube tester which included the combination with a portable flashlight of the type having a casing, a flared head portion including a bulb and bulb socket, a light circuit, and a switch in the circuit having an operating button slidably mounted on the side of the casing intermediate the ends of the casing. The improvement included a fuse and lamp testing device including an insulated contact having an operative and an inoperative position slidably mounted in the flared head portion. The flared head had a transverse slot intermediate its ends through which one end of the contact extended. The contact had an enlarged inner body portion and a reduced outer portion with the inner portion being provided with a rectangular opening of a greater length and width than the diameter of the light bulb socket and through which the socket extended. A depending contact portion was on the outer end of the contact. The contact, in its operative position, only was in contact with the bulb socket in a closed circuit, with the light circuit both in the "on" and in the "off" positions of the switch. The lamp circuit was closed when the terminals of an operative lamp or fuse to be tested were brought respectively into contact with the casing and the sliding contact.

U.S. Pat. No. 2,839,724 patented Jun. 17, 1958 by J. Chandler et al, provided a flashlight and electrical tester in the form of an electrical flashlight comprising an electrically conductive casing constituting a ground for a contained battery unit, an electrically conductive bulb holder mounted in one end of the casing and insulated therefrom, an electrical contact affixed to the bulb holder, and switch means including a longitudinally slidable permanently grounded contact member flexibly engageable with one face of the affixed contact and slidable into and out of such engagement. A normally protruding conductive plunger was mounted in, and was insulated from, the casing opposite the engaging end of the grounded contact member and was adapted, when depressed, to engage the end of the grounded contact member and to flex it from contact with the affixed contact and thereby open the switch contacts. An auxiliary contact was carried by the plunger in position to engage the other face of the affixed contact when the plunger was depressed to a position to flex the grounded contact member and to open the switch contacts.

U.S. Pat. No. 3,007,110 patented Oct. 31, 1961 by H. Rosenstrach, provided a flashlight electrical utility tester including the combination with a flashlight having a control switch, a casing, a flashlight light bulb and flashlight batteries within the casing. The combination included contact terminals which were insulated from and were independent of the switch, and were in spaced relation to, and were insulated from each other. They had cup-shaped main portions as well as rim portions provided with open slots and were mounted with their main portions on the outer side of the flashlight casing. They were adapted for being connected to terminals of an electrical circuit. An electrical current may pass from a first one of said contact terminals, over a conductive object to be tested and conductively connected to the contact terminals to a second one of the contact terminals, through the casing, the batteries, and to the light bulb to the first contact terminal.

U.S. Pat. No. 3,257,610 patented Jun. 21, 1966 by R. O. Fariss, provided a portable flashlight having circuit testing means and a rotating telescoping head portion with cut-out for exposing a test contact in the form of a flashlight. The device included a casing incorporating battery means and a head structure telescoped over and coupled to the upper end of the casing and incorporating a light bulb. An exposed first conducting contact surface was provided on the casing. A second contact surface was provided on the upper portion of the casing beneath the portion of the head structure telescoped thereover. The head structure included a cut-out in its telescoping portion such that rotation thereof exposed the second contact through the cut-out. Connecting means were provided for connecting the first and second contacts with the battery means and light bulbs so that short-circuiting of the first and second contacts lights the light bulb. In this way, fuses and the like may be tested by bridging the same across the first and second contacts.

All of the above described patented devices performed their desired objects fairly well. In spite of the attainment of such objects, the devices fell short of providing an optimum device.

SUMMARY OF THE INVENTION

Aims of the Invention

In those devices, which require the addition of elements to the end thereof, the flashlight became more expensive to make and was more complicated to use as a tester. As thus noted, there were problems with the devices of the prior art. While continuity testers are old in the art and work well for their intended purposes, the more common types are not intended to be carried by the user continually.

In the devices which included sliding contacts, there was the problem of making adequate electrical contact with the sliding member, coupled with the fact that sliding contacts can become inoperative (by corrosion) if they are not used frequently or by wear if used frequently.

On the other hand, in the devices which included one fixed contact and a second electrical contact made by the metallic body of the flashlight or by a metallic strip secured to the flashlight, there was the likelihood of faulty connection between the contact surfaces of the electrical device being tested and the electrical contacts of the flashlight.

Furthermore, in devices where there were two spaced-apart electrical contacts, the device was generally only adaptable for the testing of a small finite number of types of electrical devices and was not universally adaptable.

The objectives of: providing simple flashlight/continuity testers and to provide a simple device by means of which circuit testing may readily be carried out, employing the light of the flashlight device as the indicating means; providing a continuity tester in which the electrical contacts are such that, for certain bulbs and fuses to be tested, they positively guide the contact points of those devices being tested into direct electrical contact with the electrical contacts of the flashlight; and of providing a continuity tester which is universally adaptable for testing a wide variety of electrical devices were achieved in the invention disclosed and claimed in the above-identified copending U.S. application Ser. No. 07/935,529 of which the present application is a continuation-in-part. That invention provided an improvement in a flashlight (or lantern) having an insulated hollow body providing an interior, and a lamp bulb and batteries in series circuit, the improvement being constituted by an electrical continuity tester. The electrical continuity tester included: an entry site, formed in the flashlight body, the entry site, including a pair of converging, sloping, facing walls, separated by a floor, the floor being penetrated by a pair of spaced-apart slits, each slit penetrating into the interior of the insulated hollow body; a first electrically-conductive strip having a contact portion, the contact portion following the contour and slope of one wall of the entry site, and passing into the interior of the body through one slit and terminating in a securement end, the other end of the first strip being in electrical contact with one end of the series circuit; a second electrically-conductive strip having a contact portion, the contact portion following the contour and slope of the other wall of the entry site, and passing into the interior of the body through the other slit, and terminating in a conducting end, the conducting end being in electrical contact with an end of the series circuit adjacent the lamp bulb, the other end of the second strip being a securement end; the size of the entry site, the angle of convergence of the walls and the spacing of the spaced-apart slits being selected so as to allow the contact portions of the strips, which follow the contours and slopes of the walls, to act as guideways to guide terminals of a circuit element being tested into suitable electrical contact.

However, while such electrical continuity tester did meet all the objections, it was still desired to have further improvement to meet further objectives.

Thus, an object of the present invention is the provision of a device of very simple construction by means of which circuit testing may readily be carried out, employing the light of the flashlight device as the indicating means.

Another object of this invention is to provide such a continuity tester in which the electrical contacts are such that, for certain bulbs and fuses to be tested, they positively guide the contact points of those devices being tested into direct electrical contact with the electrical contacts of the flashlight.

Yet another object of this invention is to provide such a continuity tester which such positive guiding means is specially constructed for testing a wide variety of electrical devices.

Statements of Invention

This invention provides an improvement in a flashlight or lantern having a shell providing an insulated hollow body and a lamp bulb and batteries in a primary series circuit, the improvement being constituted by an electrical continuity tester, such electrical continuity tester including: a testing series circuit coupled to the primary series circuit, such testing series circuit comprising a testing site, formed in the shell, the testing site including a pair of converging, sloping, facing walls, separated by a floor, the floor being provided with a pair of spaced-apart channels, an initial component of the testing series circuit being in the form of an electrically-conductive strip having a contact portion, the contact portion following the contour and slope of one sloping wall of the testing site, and terminating at one end in a first end which reposes within an associated one such channel, the other end of the initial component being in electrical contact with one end of the primary series circuit; a complementary component of the testing series circuit in the form of an electrically-conductive strip having a contact portion, the contact portion following the contour and slope of the other sloping wall of the testing site, and terminating at one end in a first end which reposes within an associated other such channel, the other end of the complementary electrically-conductive strip being in electrical contact with one end of the primary series circuit adjacent the lamp bulb; the size of the testing site, the angle of convergence of the walls and the spacing of the spaced-apart channels being selected so as to allow the contact portions of the strips, which follow the contours and slopes of the sloping walls, to act as guideways to guide terminals of a circuit element being tested into suitable electrical contact.

In use, if a fuse is being tested, electrical continuity is determined by the lighting up of the light bulb of the flashlight. On the other hand, if a bulb is being tested, electrical continuity is determined by the lighting of the bulb being tested and/or by the lighting of the lamp bulb of the flashlight.

Other Features of the Invention

This invention thus provides means for converting the common flashlight or lantern into an electrical continuity tester. Defects in fuses and bulbs may be checked whenever the battery voltage is sufficient to provide current flow in a continuous circuit.

In one feature of this invention one terminating end of the initial component and one terminating end of the complementary component are secured within the associated the channels.

In another feature of this invention, one terminating end of the initial component and one terminating end of the complementary component are flexingly disposed adjacent respective associated sloping walls of the testing site, to be resiliently movingly situated adjacent an associated such channel. In a facet of this feature of this invention, the testing site includes a raised step on the floor between the two channels to provide a limit on resilient flexing of the terminating ends.

In yet another feature of this invention, the strips extend along the longitudinal axis within a channel formed within the body of the flashlight, the channel being either a dovetail-in-cross-section channel, or a rectangular-in-cross-section channel.

In still another feature of this invention, the strips extend along the longitudinal axis within a channel formed within a platform which is either superposed atop the body of the flashlight, or is a projection formed as an integral part of the body of the flashlight, the channel being either a rectangular-in-cross-section channel, or a dovetail-in-cross-section channel.

In yet another feature of this invention, a short-circuit preventer is provided comprising an electrically non-conductive cover, or strip or cap, which is slidably engaged within the channel, the base of the electrically non-conductive cover, strip or cap having a cross-section which is complementary with the Channel within which it is adapted to slide, e.g., the base may have an outwardly-flared tenon, to be slidable and retained within a dovetail channel, or may have a pedestal base slidable and retained within a rectangular channel, or may have a throat defined by a pair of facing arcuate wells, the base having a "T" shaped cross-section complementary to the cross-section of the channel, where the channel is rectangular in cross-section and an upper grippable surface.

Thus in a still further feature of this invention, a short-circuit preventer is provided comprising an electrically non-conductive cover, or strip or cap slidably engaged within the channel, the electrically non-conductive cover, or strip or cap having an open rectangular base having inwardly-directed legs embraceable within longitudinally-extending guideways in the side walls of the platform or in the projection as a projection formed as an integral part of the body of the flashlight, and an upper grippable surface. Alternatively, the base may have an outwardly flared tenon cooperating with a dovetail channel.

In yet another feature of this invention, a short-circuit preventer is provided comprising an electrically non-conductive cover, or strip or cap slidably engaged within the channel having an open longitudinal guideway having a longitudinally-extending throat having opposed facing arcuate side walls, the cap being of inverted T-shape, the horizontal portion of the "T" being adapted to be guided by the arcuate walls of the throat, and the vertical part of the "T" being adapted to slide within the throat. In yet another feature, the channel is retangular in cross-section and having a throat defined by a pair of facing arcuate wells, and wherein the base has a "T" shaped cross-section complementary to the cross-section of the channel.

In a still further feature, a short-circuit preventer is provided comprising a cover, strip or cap which is slidably engaged within the longitudinally-extending channel, the cover, strip or cap having a base whose cross-section is complementary with the cross-section of the channel within which it is slidable, the base also including an inset, longitudinally-extending electrically-conductive strip, and an upper grippable surface. In such improvement, the channel may be dovetail-in-cross-section, and the base may include an outwardly flared tenon complementary with the dovetail.

In a still further feature, an auxiliary device is provided comprising a first probe engaged with the other end of the initial component and in electrical contact with a battery, and a second probe in electrical contact with the other end of the complementary component.

According to another feature of the invention, the strips, which may extend along the longitudinal axis, preferably along the bottom thereof, of the flashlight, (or lantern) may be either of equal or of unequal length. One such strip would then be electrically connected to the rear end of the primary series circuit, and the other such strip would be electrically connected to the bulb end of the primary series circuit.

According to another feature of the invention, the strip may be in the form of transverse disconnected strips disposed across the bottom end of the flashlight (or lantern). The strips may be of equal length or of unequal length. One end of one strip, which penetrates the flashlight (or lantern) is electrically connected to the rear end of the series circuit, while one end of the other strip, which also penetrates the flashlight (or lantern), is electrically connected to the bulb end of the series circuit. The strips also include the contact portions within the entry site as previously described.

According to another feature of the invention, the strips partially encircle a region of the flashlight (or lantern). One end of one strip, which penetrates the flashlight (or lantern), is electrically connected to the rear end of the series circuit, while one end of the other strip, which also penetrates the flashlight (or lantern), is electrically connected to the bulb end of the series circuit. These ends are situated within the entry site as previously described.

Another embodiment of the invention, which can be used with any of these embodiments of the invention, is the provision of a fuse-gripping well, either permanently secured or integral with or disconnectly attached to, the cylindrical end of the flashlight.

BRIEF DESCRIPTION OF THE DRAWINGS

In the accompanying drawings,

FIG. 14 is an enlargement of the testing site of the present invention showing another form of maintaining the continuity of the testing series circuit;

FIG. 15 is a greater enlargement of a portion of the enlargement of FIG. 14;

FIG. 16 is a section through the line XVI—XVI of FIG. 14;

FIG. 17 is a perspective view of yet another embodiment of this invention, showing one manner of providing short-circuiting protection;

FIG. 18 is a perspective view of yet another embodiment of the present invention showing an alternative manner of providing short-circuiting protection;

DESCRIPTION OF EMBODIMENTS OF THE INVENTION IN PATENT APPLICATION SER. NO. 07/935,529

Figure 1:
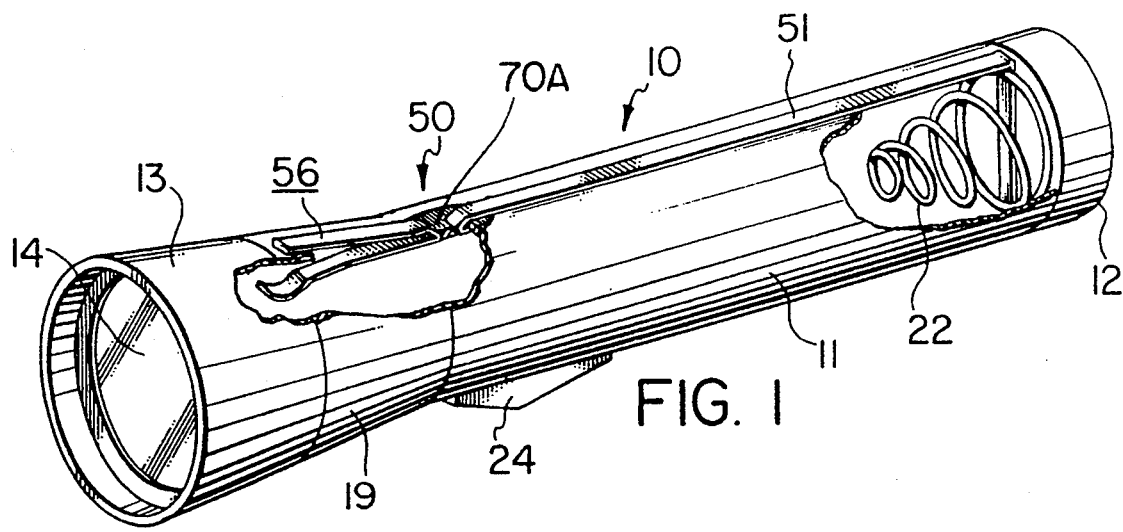
FIG. 1 is a perspective view, partly broken away of one embodiment of the invention in the above-identified patent application Ser. No. 07/935,529 showing one form of maintaining continuity of the series circuits.
Figure 2:
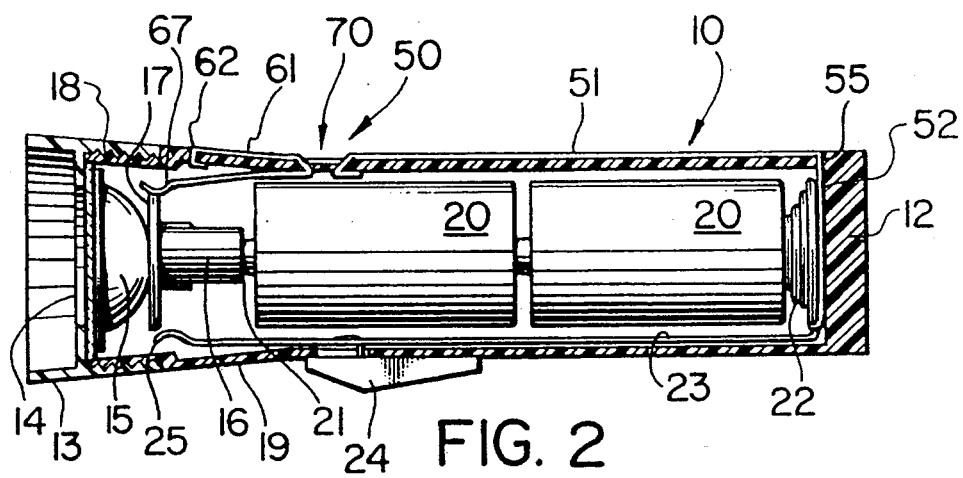
FIG. 2 is a central longitudinal cross-section of the embodiment of the invention in the above-identified patent application Ser. No. 07/935,529 showing one form of maintaining continuity of the series circuits shown in FIG. 1.
Figure 2A:
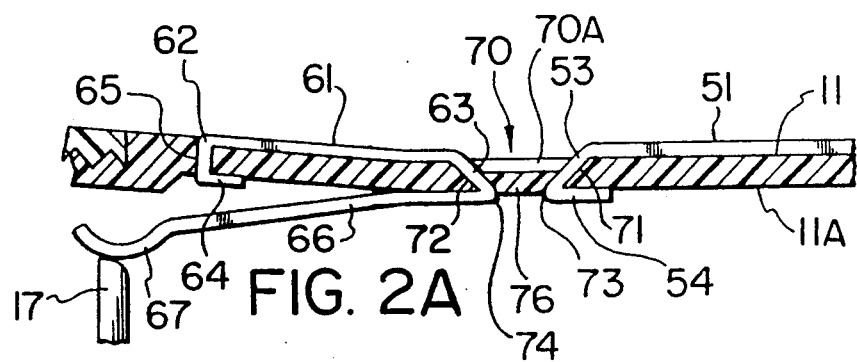
FIG. 2A is an enlargement of the testing portion of the invention in the above-identified patent application Ser. No. 07/935,529 showing one form of maintaining continuity of the series circuits shown in FIGS. 1 and 2.

Description of FIGS. 1, 2 and 2A

FIGS. 1 and 2 show the flashlight 10, which is improved according to the invention disclosed and claimed in the above-referred patent application Ser. No. 07/935,529. As is conventional, the flashlight 10 includes a main cylindrical body 11 provided with an end cap 12 (which may be an attached separate cap, or a cap integral with body 11) and an outwardly-flared front end 13 having an inset transparent material, e.g. glass 14, protecting a bulb 15, which is mounted in a socket 16, which also has an electrically-conducting flange 17 therearound. Access to the bulb 15 is by way of threaded engagement 18 between the flared front end 13 and the diverging forward end 19. Within the main cylindrical body 11 is a pair of batteries 20 urged into contact with the electrical contact 21 of the bulb by means of coil spring 22. An electrical "on-off" switch means is provided by internal electrical conductor 23 extending from the behind spring 22 to a switch 24. As shown in FIG. 2, it is in the "off" position. Conductor 23 is cantilevered at flexible end 25 towards electrically-conducting flange 17. Movement of the switch 24 to the left (as seen in FIG. 2) will cause the flexible end 25 to contact electrically-conducting flange 17, thereby completing a primary series circuit and causing the bulb 15 to light.

To provide the circuit tester 50, the flashlight 10 is provided with an entry site 70 which includes a depressed area 70A (See FIG. 2A). Entry site 70 includes a pair of opposed, converging walls 71,72. The walls are separated by a floor 76 pierced by a pair of spaced-apart slits 73,74. The significance of the geometric orientation of walls 71,72 and slits 73,74 will now be described.

The longitudinal length of the entry site 70 which includes depressed area 70A and floor 76 and the angle of convergence of the opposed converging walls 71,72 are selected to be such as to enable the contact portions 53,63 of the strips 51,61 which enter the flashlight 10 through the slits 73,74 in the floor 76 to act as a guideway to guide contact ends of bulbs or fuses to be tested (not shown) into suitable electrical contact.

The circuit tester 50 shown in FIGS. 1, 2 and 2A includes an initial component of a testing series circuit coupled to the primary series circuit, i.e., a longitudinally-extending strip 51 [either projecting above the surface of the body 11, or disposed within a slot (not shown) within the surface of the body 11] having one end 52 within the interior of the body 11 at the rear end of the flashlight 10 through slit 55, so as to be in electrical contact behind, and with, spring 22. The other end of strip 51 includes a body-penetrating contact portion 53 which follows the contour and slope of wall 71, and enters the body 11 through slit 73 and finally terminates at securement end 54 in contact with the inner surface 11A of body 11. Thus, the body-penetrating contact portion 53 enters the body 11 through one slit 73 which is generally of the same width and thickness as the strip 51.

The circuit tester 50 also includes a complementary component of the testing series circuit, i.e., another longitudinally-extending strip 61, having a body-penetrating entry portion 62 which follows the contour and slope of diverging forward end 19 of the body 11. This portion 62 enters the interior of the flashlight 10 through a slit 65 and terminates in a securement end 64 in contact with the inner surface 11A of body 11. Strip 61 includes a body-penetrating contact portion 63 which enters body 11 through slit 74 and finally terminates in a forwardly-extending arm 66 which includes a terminal contact end 67 in electrical contact with flange 17.

While the circuit tester 50 is shown as external strips 51,61 which are inset into the body 11, the external strips 51,61 can also be raised above the body 11. Furthermore, the strips 51,61 may be created of electrically-conductive paint painted on an electrically non-conductive body; or may be created of electrically conductive plastic, provided on electrically non-conductive plastic; or may be created as a conductive metal strip formed by an electrically-non-conductive coating on a metal body, the non-coated portions providing two separated metal strips, the ends of the metal strips being insulated from the metal body.

While the strip 61 is shown as being inset within a channel in the flashlight body 11, and the strip 51 is shown as being raised atop the flashlight body 11, it is desirable to include a pair of parallel ridges alongside the strips 51 and 61 to prevent accidental short circuitry of the fuse tester 50.

The longitudinal length of the entry site and the angle of convergence of the opposed converging walls are selected to be such as to enable the contact portions of the strips which enter the flashlight through the slits in the floor to act as a guideway to guide contact ends of bulbs or fuses to be tested into suitable electrical contact. If the bulb being tested is not burned out or otherwise defective, such bulb or the flashlight bulb, or both, will light. If the fuse being tested is not burned out or otherwise defective, the flashlight bulb will light.

Figure 3:
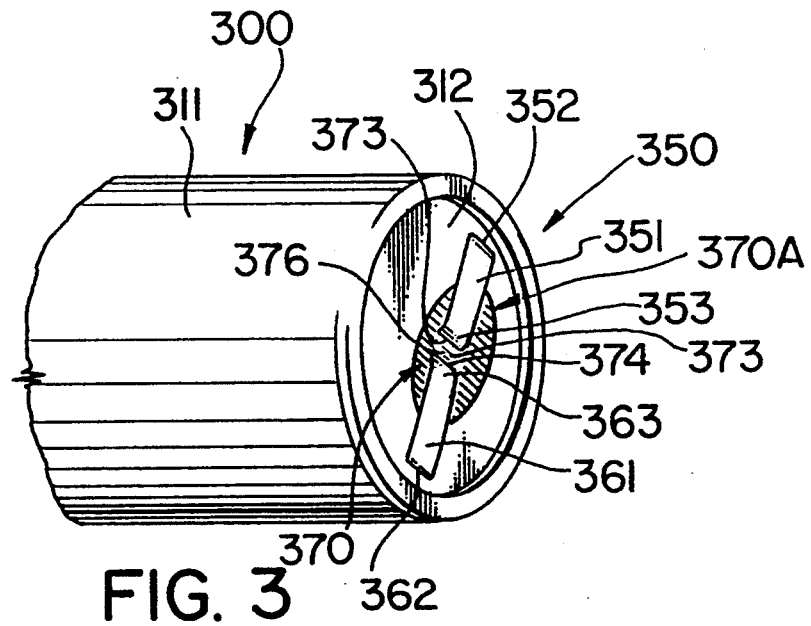
FIG. 3 is a partial rear perspective view of an alternative embodiment of the invention in the above-identified patent application Ser. No. 07/935,529 showing one form of maintaining continuity of the series circuits.

Description of FIG. 3

FIG. 3 shows an alternative continuity testing device according to the invention disclosed and claimed in the above-referred patent application Ser. No. 07/935,529, namely 350, on flashlight 300. The circuit tester 350 shown in FIG. 3 includes an initial component of the testing series circuit, i.e., a strip 351 having one end (not shown) entering the body 311 through slit 352. Such entry end is in electrical contact behind and with a spring (not shown) but which is equivalent to spring 22 in FIG. 1. The other end of strip 351 includes a body-penetrating contact portion 353 which follows the contour and slope of a wall (equivalent to wall 71 in FIG. 2A), which enters through a slit 373 at entry site 370 which includes depressed area 370A (slit 373 being equivalent to slit 73 in FIG. 2A) and which terminates in a securement end (not shown) but which is equivalent to end 64 in FIG. 2A. Thus the body-penetrating contact portion 353 enters the body 311 through one slit 373 at entry site 370, the slit being generally of the same width and thickness as the strip 351.

The circuit tester 350 also includes a complementary component of the testing series circuit, i.e., another outer strip 361, having an end (not shown) which enters body 311 through slit 362. Such entry end is secured to the interior of the body 311 in contact with a spring (not shown) which is equivalent to spring 22 in FIG. 1. The other end of strip 361 includes a body-penetration contact portion 363 which follows the contour and slope of a wall (not shown) but which is equivalent to wall 72 in FIG. 2A, and which enters through a slit 374 at entry site 370, slit 374 being equivalent to slit 74 in FIG. 2A. The body-penetrating contact portion 363 enters the body 311 through such slit 374 at entry site 370, the slit being generally of the same width and thickness as the strip 351. Such other end extends to an arm (not shown) but which is equivalent to arm 67 in FIG. 2A which contacts a flange, (not shown) but which is equivalent to flange 17 in FIG. 2.

The longitudinal length of the entry site and the angle of convergence of the opposed converging walls are selected to be such as to enable the ends of the strips, which enter the flashlight through the slits in the floor, to act as a guideway to guide contact ends of bulbs, or fuses, to be tested into suitable electrical contact. If the bulb being tested is not burned out or otherwise defective, such bulb or the flashlight bulb, or both, will light. If the fuse being tested is not burned out or otherwise defective, the flashlight bulb will light.

Figure 4:
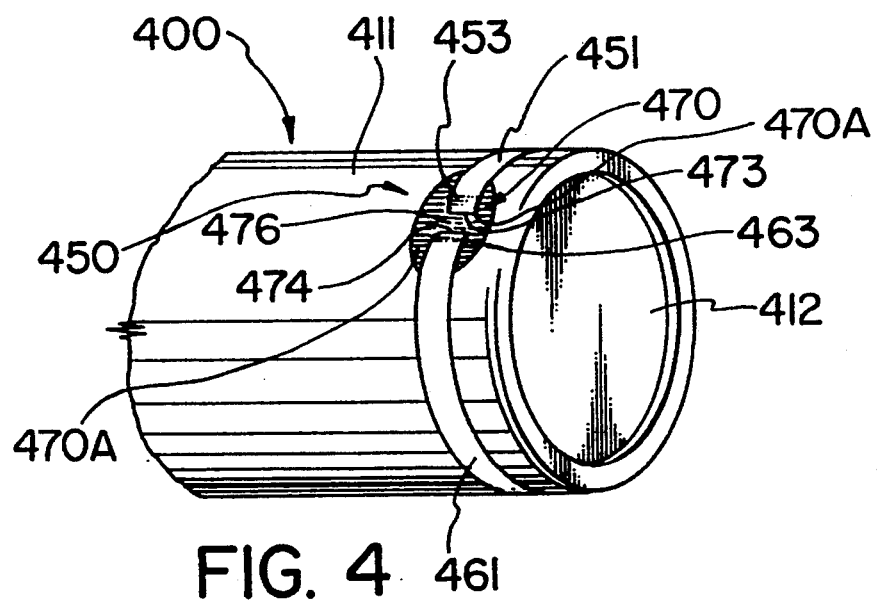
FIG. 4 is a partial rear perspective view of another alternative embodiment of the invention in the above-identified patent application Ser. No. 07/935,529 showing one form of maintaining continuity of the series circuits.
Figure 5:
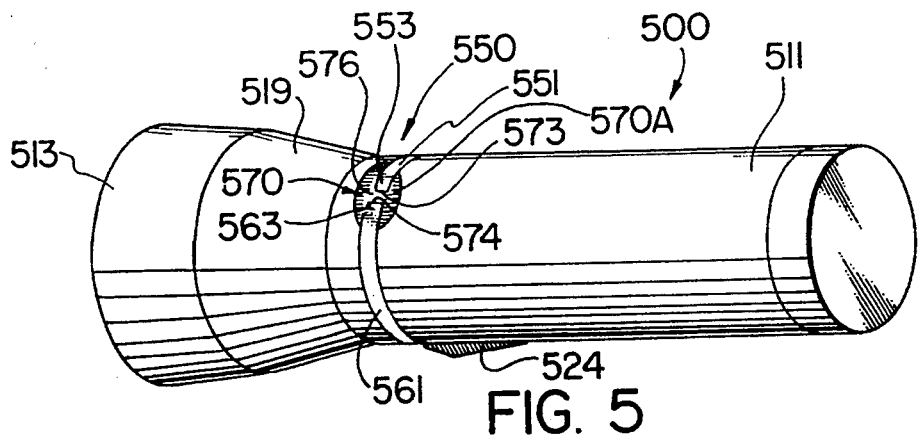
FIG. 5 is a perspective partial view of yet another alternative embodiment of the invention in the above-identified patent application Ser. No. 07/935,529 showing one form of maintaining continuity of the series circuits.

Description of FIGS. 4 and 5

FIGS. 4 and 5 show two other alternative electrical continuity testing devices according to the invention disclosed and claimed in the above-referred patent application Ser. No. 07/935,529, namely 450 and 550. As seen in FIG. 4, the circuit tester 450 includes an initial component of the testing series circuit and a complementary component of the testing series, i.e., two encircling bands 451 and 461, respectively, near the end 412 of the flashlight 400. Band 451 has one contact end 453 entering the body 411 through slit 473, which is equivalent to slit 73 in FIG. 2A at entry site 470. Another end (not shown) enters the flashlight 400 and is in electrical contact behind, and with, a spring (not shown) but which is equivalent to spring 22 in FIG. 1. The entry site 470 is of generally depressed configuration 470A terminating in floor 476. The contact end 453 is thus a body-penetrating contact portion which follows the contour and slope of a wall (not shown) but which is equivalent to wall 71 in FIG. 2A and which enters through slit 473 (equivalent to slit 73 in FIG. 2A) in floor 476. Thus, the body-penetrating contact portion 453 enters the body 411 through one slit 473 at entry site 470, the slit being generally of the same width and thickness as the band 451.

One end of band 461 (not shown) enters the flashlight 400 and is in electrical contact with a flange (not shown) but which is equivalent to flange 17 in FIG. 2. The other end of band 461 enters the body 411 through slit 474 at entry site 470. Contact end 463 is thus a body-penetrating contact portion which follows the contour and slope of a wall (not shown) but which is equivalent to wall 72 of FIG. 2A and which enters through slit 474 at entry site 470, which slit is equivalent to slit 74 of FIG. 2A in floor 476. Thus, the body-penetrating contact portion 463 enters the body 411 through one slit 474 at entry site 470, the slit being generally of the same width and thickness as the strip 451*b*.

The longitudinal length of the entry site and the angle of convergence of the opposed converging walls are selected to be such as to enable the ends of the strips, which enter the flashlight through the slits in the floor, to act as a guideway to guide contact ends of bulbs, or fuses, to be tested into suitable electrical contact. If the bulb being tested is not burned out or otherwise defective, such bulb or the flashlight bulb, or both, will light.

If the fuse being tested is not burned out or otherwise defective, the flashlight bulb will light.

As seen in FIG. 5, the circuit tester 550 includes an initial component of the testing series circuit, and a complementary component of the testing series circuit, i.e., two encircling bands 551 and 561 near the end 513 of the flashlight 500. Band 551 has one contact end 553 entering the body 511 through slit 573, which is equivalent to slit 73 in FIG. 2A at entry site 570. Entry site 570 is of generally depressed configuration 570A terminating in floor 576. Another end (not shown) enters the flashlight 500 and is in electrical contact behind, and with, a spring (not shown) but which is equivalent to spring 22 in FIG. 1. The contact end 553 is thus a body-penetrating contact portion which follows the contour and slope of a wall (not shown) but which is equivalent to wall 71 in FIG. 2A and which enters through slit 573 at entry site 570 (equivalent to slit 73 in FIG. 2A) in floor 576. Thus, the body-penetrating contact portion 553 enters the body 511 through one slit 573 at entry site 570, the slit being generally of the same width and thickness as the strip 551.

One end of band 561 (not shown) enters the flashlight 500 and is in electrical contact with a flange (not shown) but which is equivalent to flange 17 in FIG. 2. The other end of band 561 enters the body 511 through slit 574 at entry site 570. Contact end 563 is thus a body-penetrating contact portion which follows the contour and slope of a wall (not shown) but which is equivalent to wall 72 of FIG. 2A and which enters through slit 574 at entry site 570, the slit being equivalent to slit 74 of FIG. 2A in floor 576. Thus, the body-penetrating contact portion 553 enters the body 511 through one slit 574 at entry site 570, the slit being generally of the same width and thickness as the band 561.

The longitudinal length of the entry site and the angle of convergence of the opposed converging walls are selected to be such as to enable the ends of the strips, which enter the flashlight through the slits in the floor, to act as a guideway to guide contact ends of bulbs, or fuses, to be tested into suitable electrical contact. If the bulb being tested is not burned out or otherwise defective, such bulb or the flashlight bulb, or both, will light. If the fuse being tested is not burned out or otherwise defective, the flashlight bulb will light.

Figure 6:
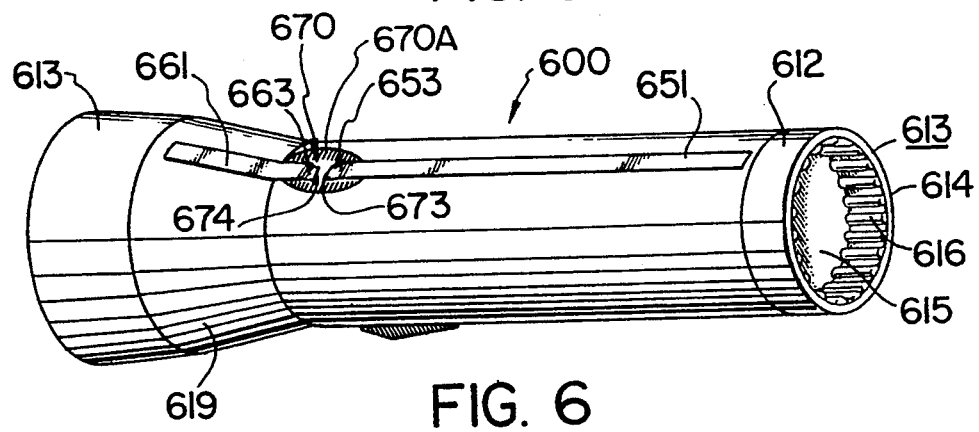
FIG. 6 is a perspective view of yet another alternative embodiment of the invention in the above-identified patent application Ser. No. 07/935,529 showing a fuse gripping well for inserting, tightening or removing fuses.

Description of FIG. 6

FIG. 6 shows a modified rear end 612 of the flashlight 600 which may be used with any of the above described embodiments of the invention in the above-referred patent application Ser. No. 07/935,529, although it is shown used with the embodiment of FIGS. 1, 2 and 2A. Thus, the same reference numbers are used in FIG. 6 as in FIG. 1 with the exception that they are in the "600" series, and so they will not be described further.

As seen in FIG. 6, the modified end is a modified integral end cap 612 which is in the form of a well 613 having upstanding cylindrical outer walls 614 and a base 615. The interior of wall 614 is slightly converging (towards base 615) and is provided with a plurality of upstanding, spaced-apart ribs 616. Ribs 616 may be used to grip a fuse to enable safe and easy removal from a fuse box, or for tightening of a fuse, or for the replacement of a fuse therein. The use of end cap 612 thus provides improved grip and safety in the maintenance, removal and replacement of fuses.

Figure 7:
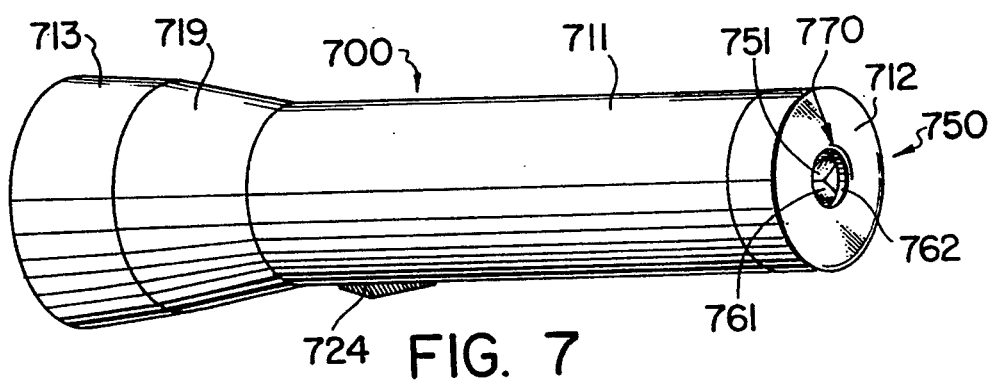
FIG. 7 is a perspective view of still another alternative embodiment of the invention in the above-identified patent application Ser. No. 07/935,529 showing one form of maintaining continuity of the series circuits.

Description of FIG. 7

FIG. 7 shows yet another embodiment of the continuity tester 750 of the invention disclosed and claimed in the above-referred patent application Ser. No. 07/935,529. This tester is in the form of a pair of spring-biased sloping converging strips 751,761 disposed within the end 712 of the flashlight 700 and within frusto-conical open recess 762 at entry site 770.

The internal ends of strips 751 and 761 are connected respectively, to the rear end of the series circuit of the flashlight 700, and to the flashlight bulb end of the series circuit of the flashlight 700 via the switch 724 of the flashlight, which is itself connected to the bulb and to the rear in the manner previously described for FIG. 1.

The diameter of the entry site and the angle of convergence of the opposed converging spring-biased strips are selected to be such as to enable the strips to act as a guideway to guide contact ends of bulbs, to be tested, into suitable electrical contact. To test the bulb, the flashlight must be turned "on". If the bulb being tested is not burned out or otherwise defective, such bulb will light.

Figure 8:
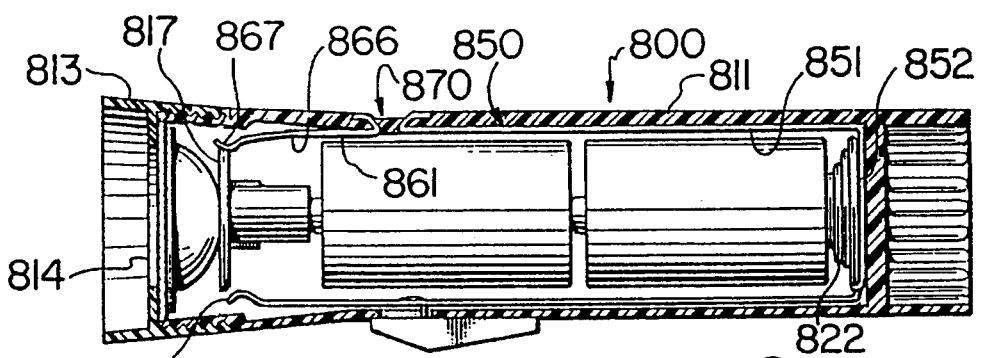
FIG. 8 is a central longitudinal cross-section of another embodiment of the invention in the above-identified patent application Ser. No. 07/935,529 showing one form of maintaining continuity of the series circuits.
Figure 8A:
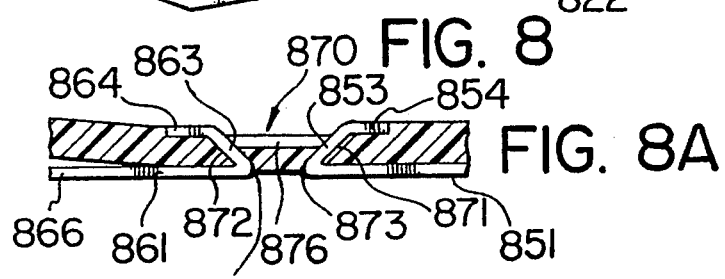
FIG. 8A is an enlargement of the testing portion of the invention in the above-identified patent application Ser. No. 07/935,529 showing one form of maintaining continuity of the series circuits shown in FIG. 8.

Description of FIGS. 8 and 8A

The circuit tester 850 of the invention disclosed and claimed in the above-referred patent application Ser. No. 07/935,529 shown in FIG. 8 shows a flashlight 800 which includes an initial component of the testing series circuit, i.e., an internal strip 851 having one end 852 in electrical contact behind, and with, a spring 822. The other end of strip 851 includes a body-emergent contact portion 853 which exits through a slit 873, at entry site 870, which also includes a depressed area 870A. Strip 851 thus follows the contour and slope of wall 871, and terminates in a securement end 854. Thus the body-emergent contact portion 853 exits the body 811 through one slit 873 at entry site 870, the slit being generally of the same width and thickness as the strip 851.

The circuit tester 850 also includes a complementary component of the testing series circuit, i.e., another inner strip 861, having contact portion 863 which exits through a slit 872 at entry site 870 and follows the contour and slope of wall 872 to provide contact portion 863. It terminates at an end 864 which is secured to the exterior of the body 811. Within body 811, strip 861 extends to an extending arm 866 which includes a terminal contact 867 which contacts flange 871. Thus, the body-emergent contact portion 863 exits the body 811 through one slit 874 at entry site 870, the slit being generally of the same width and thickness as strip 861.

Contacts 873 and 854 are at entry site 870 which has a generally depressed region 870A and has a floor 876 which is penetrated by slits 874 and 872.

The longitudinal length of the entry site and the angle of convergence of the opposed converging walls are selected to be such as to enable the ends of the strips, which enter the flashlight through the slits in the floor, to act as a guideway to guide contact .ends of bulbs, or fuses, to be tested into suitable electrical contact. If the bulb being tested is not burned out or otherwise defective, such bulb or the flashlight bulb, or both, will light. If the fuse being tested is not burned out or otherwise defective, the flashlight bulb will light.

Figure 9:
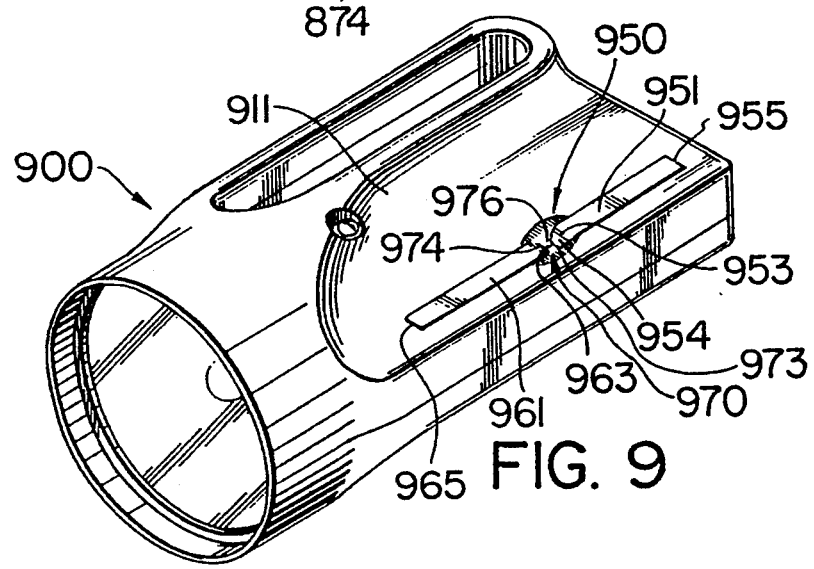
FIG. 9 is a perspective view of another alternative embodiment of the invention in the above-identified patent application Ser. No. 07/935,529 showing one form of maintaining continuity of the series circuits.

Description of FIG. 9

FIG. 9 shows a continuity tester 950 in association with a lantern 900. As seen in FIG. 9, the continuity tester 950 of the invention disclosed and claimed in the above-referred patent application Ser. No. 07/935,529 includes an initial component of the testing series circuit, i.e., a longitudinally-extending outer strip 951 having one end (not shown) but which is equivalent to end 52 of FIG. 2A within the interior of the body 911 at the rear end of the lantern 900 through slit 955 to be in electrical contact behind, and with, a spring (not shown) but which is equivalent to spring 22 in FIG. 1. The other end of strip 951 includes a body-penetrating contact portion 954 which follows the contour and slope of a wall (not shown) but which is equivalent to 71 in FIG. 2A. It then penetrates body 911 through slit 973 at entry site 970 which includes depressed area 970A, and finally terminates in a securement end (not shown) but which is equivalent to securement end 54 in FIG. 2A in contact with the inner surface of body 911. Thus, the body-penetrating contact portion 953 enters the body 911 through one slit 973 at entry site 970, the slit being generally of the same width and thickness as the strip 951.

The circuit tester 950 also includes another longitudinally-extending strip 961, having a body-penetrating entry (not seen, but which is equivalent to 62 in FIG. 2A). This end enters the interior of the lantern 910 through a slit 965 and terminates in a securement end (not shown) but which is equivalent to securement end 64 in FIG. 2A in contact with the inner surface of the body 911. Strip 956 includes a body-penetrating contact portion 963 which enters through the slit 974 at entry site 970 and finally terminates in a forwardly-extending arm (not shown) but which is equivalent to 66 in FIG. 2A which includes a contact end (not shown) but which is equivalent to 67 in FIG. 2A in electrical contact with a flange (not shown) but which is equivalent to 17 in FIG. 2. Thus, the body-penetrating contact portion 963 enters the body 911 through one slit 974 at entry site 970, the slit being generally of the same width and thickness as the strip 961.

The longitudinal length of the entry site and the angle of convergence of the opposed converging walls are selected to be such as to enable the ends of the strips, which enter the lantern through the slits in the floor, to act as a guideway to guide contact ends of bulbs, or fuses, to be tested into suitable electrical contact. If the bulb being tested is not burned out or otherwise defective, such bulb or the lantern bulb, or both, will light. If the fuse being tested is not burned out or otherwise defective, the lantern bulb will light.

The particular continuity tester 950 shown, is the one shown in FIGS. 1, 2 and 2A. However, with suitable modifications, which would be clear to a person skilled in this art, the embodiments of the continuity tester described in any of FIGS. 1 to 8 could be used.

Figure 10:
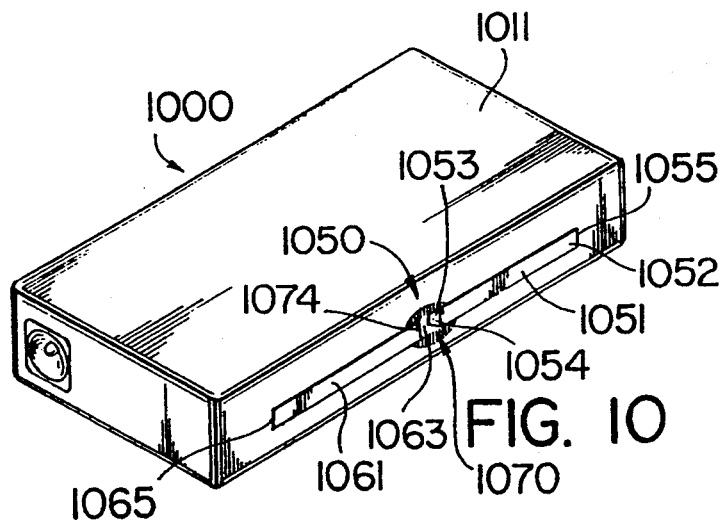
FIG. 10 is a perspective view of another alternative embodiment of the invention in the above-identified patent application Ser. No. 07/935,529 showing one form of maintaining continuity of the series circuits.

Description of FIG. 10

As seen in FIG. 10, the flashlight 1000 includes the continuity tester 1050 of the invention disclosed and claimed in the above-referred patent application Ser. No. 07/935,529 which includes an initial component of the testing series circuit, i.e., a longitudinally-extending outer strip 1051 having one end (not shown) but which is equivalent to 52 in FIG. 2A within the interior of the body 1011 at the rear end of the flashlight 1000 through slit 1055 and then to be in electrical contact behind, and with, a spring (not shown) but which is equivalent to spring 22. The other end of strip 1051 includes a body-penetrating contact portion 1054 which follows the contour and slope of a wall (not shown) but which is equivalent to 71 in FIG. 2A, and thence through slit 1073 at entry site 1070 which includes a depressed area 1070A. The strip 1051 finally terminates in a securement end (not shown) but which is equivalent to 54 in FIG. 2A in contact with the inner surface of body 1011. Thus the body-penetrating contact portion 1053 enters the body 1011 through one slit 1073 at entry site 1070, the slit being generally of the same width and thickness as the strip 1051.

The circuit tester 1050 also includes a complementary component of the testing series circuit, i.e., another longitudinally-extending strip 1.061, having body-penetrating entry portion (not shown) but which is equivalent to 62 in FIG. 2A, and which enters the interior of the flashlight 1000 through a slit 1065. The strip terminates in a securement end (not shown) but which is equivalent to 64 in FIG. 2A in contact with the inner surface body 1011. Strip 1056 includes a body-penetrating contact portion 1063 which enters through the slit 1074 at entry site 1070 and finally terminates in a forwardly-extending arm (not shown) but which is equivalent to 66 in FIG. 2A which includes a contact end (not shown) but which is equivalent to 67 in FIG. 2A in electrical contact with a flange (not shown) but which is equivalent to 17 in FIG. 2A. Thus, the body-penetrating contact portion 1063 enters the body 1011 through one slit 1074 at entry site 1070, the slit being generally of the same width and thickness as the strip 1061.

The longitudinal length of the entry site and the angle of convergence of the opposed converging walls are selected to be such as to enable the ends of the strips, which enter the flashlight through the slits in the floor, to act as a guideway to guide contact ends of bulbs, or fuses, to be tested into suitable electrical contact. If the bulb being tested is not burned out or otherwise defective, such bulb or the flashlight bulb, or both, will light. If the fuse being tested is not burned out or otherwise defective, the flashlight bulb will light.

The particular continuity tester 1050 shown, is the one shown in FIGS. 1, 2 and 2A. However, with suitable modifications, which would be clear to a person skilled in this art, the embodiments of the continuity tester described in any of FIGS. 1 to 8 could be used.

DESCRIPTION OF PREFERRED EMBODIMENTS OF THE PRESENT INVENTION

Figure 11:
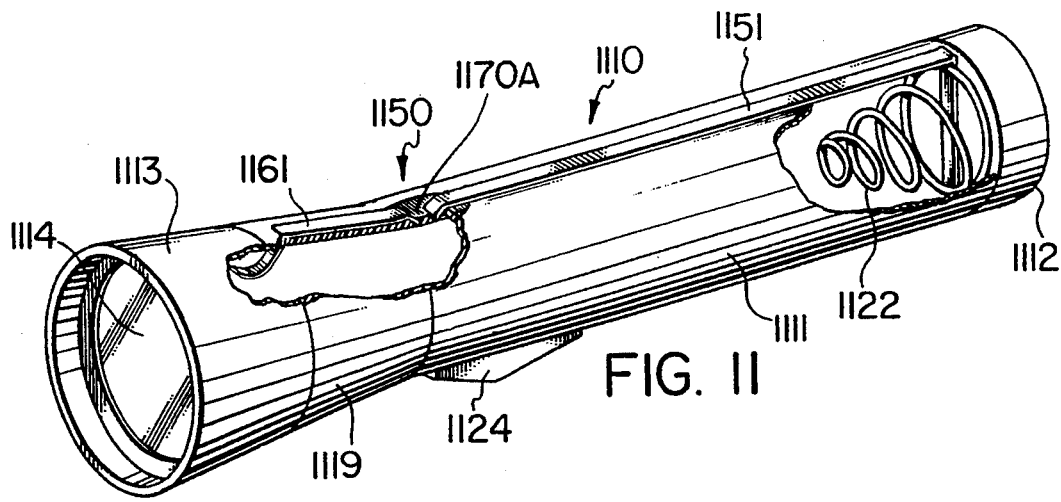
FIG. 11 is a perspective view, partially-broken away, of one embodiment of the present invention showing another structure for maintaining continuity of the series circuits.
Figure 12:
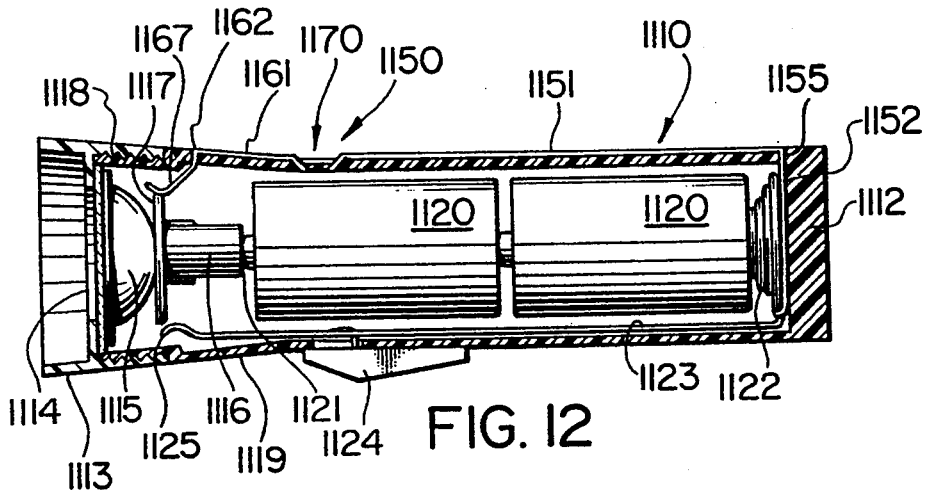
FIG. 12 is a central longitudinal cross-section of the embodiment of the present invention of FIG. 11 showing in greater detail one form of maintaining continuity of the testing series circuits.
Figure 13:
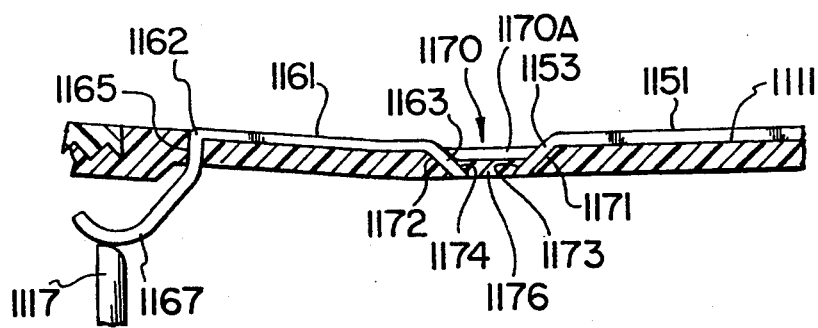
FIG. 13 is an enlargement of the testing site of the embodiment of the present invention shown in FIGS. 11 and 12.

Description of FIGS. 11, 12 and 13

FIGS. 11 and 12 show the flashlight 1100, which is improved according to the present invention. As is conventional, the flashlight 1100 includes a main cylindrical body 1111 provided with an end cap 1112 (which may be an attached separate cap, or a cap integral with body 1111) and an outwardly-flared front end 1113 having an inset transparent material, e.g., glass 1114, protecting a bulb 1115, which is mounted in a socket 1116, which also has an electrically-conducting flange 1117 therearound. Access to the bulb 1115 is by way of threaded engagement 1118 between the flared front end 1113 and the diverging forward end 1119. Within the main cylindrical body 1111 is a pair of batteries 1120 urged into contact with the electrical contact 1121 of the bulb by means of coil spring 1122. Electrical contact 1121 of the bulb to batteries 1120 is by means of coil spring 1122. An electrical "on-off" switching is provided by internal electrical conductor 1123 extending from the behind spring 1122 to a switch 1124. As shown in FIG. 12, such switch is in the "off" position. Conductor 1123 is cantilevered at flexible end 1125 towards electrically-conducting flange 1117. Movement of the switch 1124 to the left (as seen in FIG. 12) will cause the flexible end 1125 to contact electrically-conducting flange 1117, thereby completing the primary series circuit and causing the bulb 1115 to light.

To provide the circuit tester 1150 of the present invention, the flashlight 1110 is provided with a testing site 1170 which includes a depressed area 1170A (see FIG. 13). Testing site 1170 includes a pair of opposed, converging walls 1171, 1172. The walls are separated by a floor 1176 provided with a pair of spaced-apart channels 1173, 1174. The significance of the geometric orientation of walls 1171, 1172 and channels. 1173, 1174 will now be described.

The longitudinal length of the entry site 1170 which includes depressed area 1170A and floor 1176 and the angle of convergence of the opposed converging walls 1171, 1172 are selected to be such as to enable the contact portions 1153, 1163 of the strips 1151, 1161 which reposes in the channels 1173, 1174 to act as a guideway to guide contact ends of bulbs or fuses to be tested (not shown) into suitable electrical contact.

The circuit tester 1150 of the present invention shown in FIGS. 11, 12 and 13 includes a testing series circuit coupled to the primary series circuit. An initial component of such testing series circuit is a longitudinally- and rearwardly-extending strip 1151 [either projecting above the surface of the body 1111, or disposed within a longitudinal recessed channel (not shown) within the surface of the body 1111]. Strip 1151 has one end 1152 within the interior of the body 1111 at the rear end of the flashlight .1110 through slit 1155, so as to be in electrical contact behind, and with, spring 1122. The other end of strip 1151 includes a contact portion 1153 which follows the contour and slope of wall 1171, and is fixed in channel 1173. Thus, the contact portion 1153 reposes within and is fixed within the body 1111 at one channel 1173 which is generally of the same width and thickness as the strip 1151.

The circuit tester 1150 also includes a complementary component of the testing series circuit, namely, another longitudinally-extending strip 1161 [either projecting above the surface of the body 1111, or disposed within a longitudinal recessed channel (not shown) within the surface of the body 1111]. Strip 1161 has one end 1162 which follows the contour and slope of the diverging forward end 1119 of the body 1111. This portion 1162 enters the interior of the flashlight 1110 through a slit 1165 and terminates in a terminal contact end 1167 in electrical contact with flange 117. The other end of strip 1161 includes a contact portion 1163 which follows the contour and slope of wall 1172 and reposes in channel 1174. Thus, the contact portion 1154 reposes within and is fixed within the body 1111 at a second channel 1174 which is generally of the same width and thickness as the strip 1161.

While the circuit tester 1150 is shown as having external strips 1151, 1161 which are inset into the body 1111, the external strips 1151, 1161 can also be raised above the body 1111. Furthermore, the strips 1151, 1161 may be created of electrically-conductive paint painted on an electrically, non-conductive body; or they may be created of electrically-conductive plastic, provided on electrically, non-conductive plastic; or they may be created as a conductive metal strip formed by an electrically, non-conductive coating on a metal body, the non-coated portion providing both separated metal strips, the ends of the metal strips being insulated from the metal body.

The longitudinal length of the testing site and the angle of convergence of the opposed converging walls are selected to be such as to enable the contact portions of the strips which reposes within, and are also fixed within the channels in the floor to act as a guideway to guide contact ends of bulbs or fuses to be tested into suitable electrical contact. If the bulb being tested is not burned out or otherwise defective, such bulb or the flashlight bulb, or both, will light. If the fuse being tested is not burned out or otherwise defective, the flashlight bulb will light.

Description of FIGS. 14, 15 and 16

FIGS. 14, 15 and 16 depict another configuration of the strips 1451 and 1461 forming the testing series circuit and their orientation. The flashlight 1410 upon which the strips are mounted and the interconnections with the primary series circuit in the flashlight are the same as previously described with reference to FIGS. 11, 12 and 13. Accordingly, the description of FIGS. 14, 15 and 16 will be directed only to the differences thereover.

The embodiment shown in FIG. 13 discloses that strips 1161 and 1151 may be disposed within a longitudinal, recessed channel within the surface of the body 1111 of the flashlight 1110. Now, as shown in FIGS. 14 and 16, the body 1411 of the flashlight 1410 is provided with a longitudinal channel 1481 recessed within the body 1411, the channel 1481 being dovetail in cross-section (as shown in FIG. 16). Strips 1451 and 1461 are wedged into channel 1481 so that the bottom surface of the strips 1451, 1461 rest on the floor 1480 of the channel 1481 (as seen in FIG. 16). The contact portion 1453 of strip 1451 is formed of a presprung, electrically-conductive metal so that, when a force which is urged against its sloping wall 1471 in the direction of one arrow 1482 is released, it would tend to spring back in the direction of the other arrow 1483. The end 1484 of contact portion 1453 reposes within, and is thus not fixed within channel 1473.

The structure and operation of the contact portion 1463 of strip 1461 and its relation to its sloping wall 1472 and its channel 1474 is the same as for strip 1451.

This enables the contact portions 1453, 1463 to be maintained in electrical contact with the contact areas of the fuse or light bulb being tested.

The embodiment shown in FIG. 13 discloses that testing site 1170 includes a pair of opposed converging walls 1171, 1172, which are separated by a floor 1176, to provide a pair of spaced-apart channels 1173, 1174. Similarly, as shown in FIGS. 14 and 15, testing site 1470 includes a pair of opposed converging walls 1471, 1472, separated by a floor 1476, to provide a pair of spaced-apart channels 1473, 1474.

It should also be noted that floor 1476 is provided with a raised step 1485 between spaced-apart channels 1473 and 1474 to limit the flexing of the contact portions 1453, 1463.

Description of FIG. 17

FIG. 17 depicts an embodiment of this invention which includes a slidable electrically non-conductive cover, or strip or cap to cover the complementary strip 1761 of the testing series circuit to prevent short circuiting of the testing series circuit. The flashlight 1710 upon which the strips 1761, 1751 are mounted and the interconnections with the primary series circuit in the flashlight are the same as previously described with reference to FIGS. 11, 12 and 13. Accordingly, the description of FIG. 17 will be directed only to the differences thereover.

The embodiment shown in FIG. 13 discloses that strips 1161 and 1151 may be disposed within a longitudinal, recessed channel within the surface of the body 1111 of the flashlight 1110. Now, as shown in FIG. 17, the body 1711 of the flashlight 1710 is provided with a longitudinal channel 1781 recessed within the body 1711, the channel 1781 being dovetail in cross-section. Strips 1751 and 1761 are wedged into channel 1781 so that the bottom surface of such strips 1751,1761 rest on the floor 1780 of the channel 1781. The contact portions 1753 and 1763 of the strips 1751 and 1761 are secured within their respective channels 1773 and 1774 as was previously described with reference to FIGS. 11, 12 and 13. While the channel 1781 is shown to be dovetail, any other channel cross-section may be provided.

The short-circuit preventer comprises a slidable, rectangular electrically non-conductive cover, or strip or cap 1790, the base thereof being provided with an outwardly-flared lower tenon 1791, and an upper, serrated, grippable surface 1792. While the base of the cover 1790 is shown as a tenon, the base may be of any suitable shape to be complementary to the cross-section of the channel 1781. The length of the electrically non-conductive cover, or strip or cap 1790 is such that when it is slid within the dovetail channel 1781 towards the end of the flashlight 1710 via its tenon 1791, it is sufficiently long to cover the strip 1761 and the testing :Bite 1770.

Description of FIG. 18

FIG. 18 depicts another embodiment of this invention which includes a slidable electrically non-conductive cover, or strip or cap to cover the complementary strip 1861 of the testing series circuit to prevent short circuiting of the testing series circuit. The flashlight 1810 upon which the strips 1861,. 1851 are mounted and the interconnections with the primary series circuit in the flashlight 1810 are the same as previously described with reference to FIGS. 11, 12 and 13. Accordingly, the description of FIG. 18 will be directed only to the differences thereover.

The embodiment shown in FIG. 13 discloses that strips 1161 and 1151 may be disposed within a longitudinal, recessed channel within the surface of the body 1111 of the flashlight 1110. Now, as shown in FIG. 18, the body 1811 of the flashlight 1810 is provided with a longitudinal channel 1881 recessed within the body 1811, the channel 1881 being dovetail in cross-section. Strips 1851 and 1861 are wedged into channel 1881 so that the bottom surface of such strips 1851,1861 rest on the floor 1880 of the channel 1881. The contact portions 1853 and 1863 of the strips 1851 and 1861 are secured within their respective channels 1873 and 1874 as was previously described with reference to FIGS. 11, 12 and 13. While the channel 1881 is shown to be dovetail, any other channel cross-section may be provided.

The short-circuit preventer comprises a slidable, rectangular electrically non-conductive cover, or strip or cap 1890 provided with an outwardly-flared lower tenon 1891, and an upper, serrated, grippable surface 1892. While the base of the cover strip or cap 1890 is shown as a tenon, the base may be of any suitable shape to be complementary to the cross-section Of the channel 18 81. The bottom face of the tenon 1891 is provided with a longitudinally-extending auxiliary contact strip 1893. The length of the electrically non-conductive cover, or strip or cap 1890 is such that when it is slid within the dovetail channel 1881 via its tenon 1891, it is sufficiently long to cover the strip 1861 and the testing site 1870.

The operation of this embodiment of the invention is opposite to that of previous embodiments. Because of the auxiliary contact strip 1893, electrical continuity to operate the flashlight exists when the protecting strip or cover or cap 1890 is slid towards the end of flashlight 1810 to bridge strips 1861, 1851. Consequently there is no need to provide a separate switch, (e.g., switch 24 in FIGS. 1 and 2) to operate the flashlight by closing the primary series circuit. Further sliding movement provides enough longitudinal space on strips 1861, 1851 to enable testing of fuses or bulbs in the manner previously described.

Figure 19:
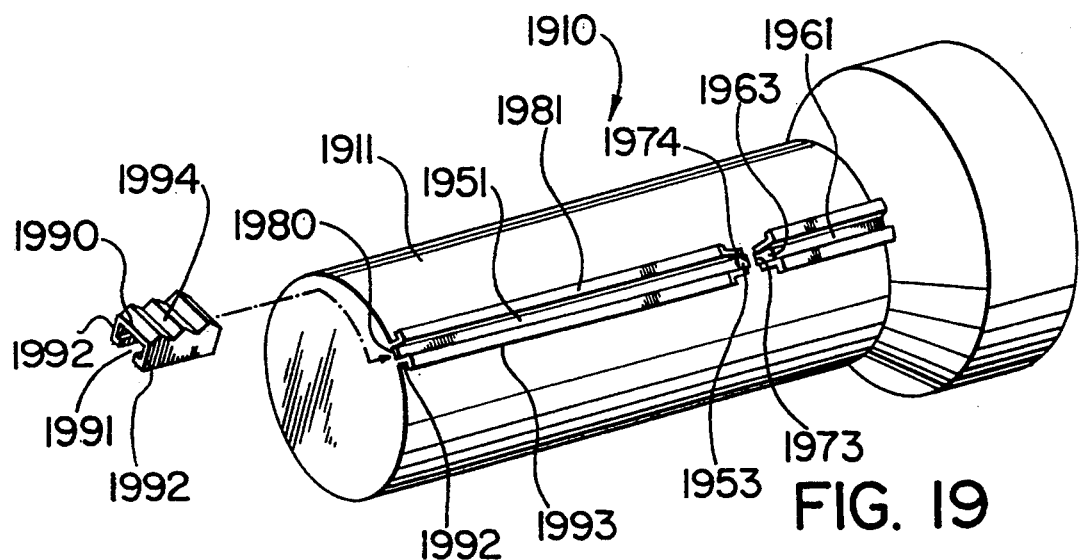
FIG. 19 is a perspective view of still another embodiment of the invention, showing still another manner of providing short circuiting protection.
Figure 19A:
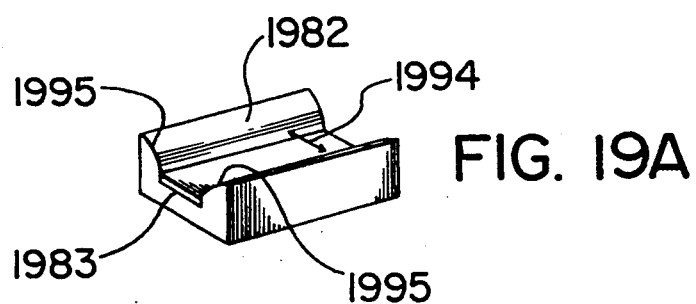
FIG. 19A is an enlarged view of another manner of providing a track for sliding interrelationship in the embodiment of FIG. 19.

Description of FIGS. 19 and 19A

FIGS. 19 and 19A depict two further embodiments of this invention which each include a slidable electrically non-conductive cover, or strip or cap to cover the complementary strip 1961 of the testing series circuit to prevent short circuiting of the testing series circuit.

The flashlight 1910 upon which the strips 2961, 1951 are mounted and the interconnections with the primary series circuit in the flashlight 1910 are the same as previously described with reference to FIGS. 11, 12 and 13. Accordingly, the description of FIGS. 19 and 19A will be directed only to the differences thereover.

The strips 1951,1961 are situated at the bottom 1980 of a generally rectangular channel 1981 forming part of a longitudinally-extending, rectangular parallelepiped platform 1982 on the body 1911 of the flashlight 1910. While platform 1981 is shown to be separate and atop flashlight body 1951, platform 1981 may be integrally molded or otherwise formed with, the flashlight body 1911. While the channel 1981 is shown as rectangular in cross-section, any other channel cross-section may be provided. The contact portions 1953 and 1963 of the strips 1951 and 1961 are secured within their respective channels 1973 and 1974 as was previously described with reference to FIGS. 11, 12 and 13.

The short-circuit preventer comprises a slidable, rectangular, electrically non-conductive cover, or strip or cap 1990 provided with an open rectangular channel 1991 having inwardly directed legs 1992 to embrace longitudinally-extending guideways 1993 in the side walls 1994 of the channel 1981 of the platform 1982, and an upper serrated grippable surface 1994. While the cap 1990 is shown to have embracing legs 1992, complementary to channel 1981, any other cross-sectional shape of the cap 1990 may be provided to be complementary to other cross-sections of the channel 1981. The length of the electrically non-conductive cover, or strip or cap 1990 is such that when it is slid towards the end of the flashlight along the guideways 1992, it is sufficiently long to cover the strip 1961 and the testing site 1970.

In the embodiment shown in FIG. 19A, the platform 1991 is provided with an open, longitudinal guideway 1983 having a longitudinally-extending throat 1994 defined by opposed arcuate walls 1995. The structure of the bottom of the electrically non-conductive cover, or strip or cap 1990 (although not shown) is of inverted "T" being shape, the horizontal part of the "T" is adapted to slide in guideway 1993 and the vertical part of the "T" being adapted to slide within the channel 1981 and within throat 1994 and contacting arcuate walls 1995.

The length of cap 1990 in this embodiment is the same as the length in the embodiment of FIG. 19.

Figure 20:
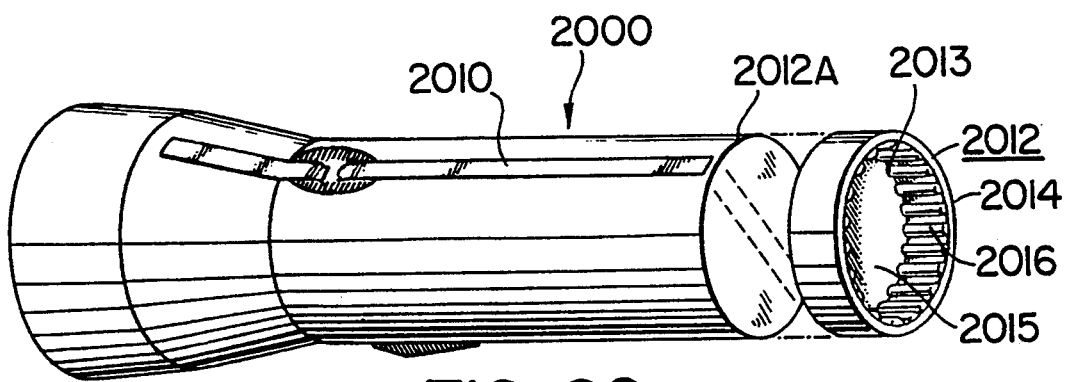
FIG. 20 is a perspective view of yet another embodiment of the present invention showing a fuse gripping well for inserting, tightening or removing fuses.

Description of FIG. 20

FIG. 20 shows a modified rear end 2012A, i.e., fuse gripper of the flashlight 2000 which may be used with any of the above-described embodiments of the invention, although it is shown used with the embodiment of FIGS. 11, 12, and 13. The flashlight 2010 upon which the fuse gripper 2012 is mounted and the interconnections with the primary series circuit in the flashlight are the same as previously described with reference to FIGS. 11,12 and 13.

As seen in FIG. 20, the modified end 2012A includes a modified end cap 2012 which is in the form of a well 2013 having upstanding cylindrical outer walls 2014 and a base 2015. The interior of wall 2014 may be slightly converging (towards base 2015) and is provided with a plurality of upstanding, spaced-apart gripping ribs 2016. Ribs 2016 may be used to grip a fuse to enable safe and easy removal from a fuse box, tightening of fuses in a fuse box, or for the replacement of a fuse therein. The use of end cap 2012 thus provides improved grip and safety in the removal, tightening and replacement of fuses.

The end cap 2012 is of the type which can be either temporarily or permanently sectored to the end of the flashlight 2010. One structure by which this removably can be achieved is by having a bayonet-type interconnection (not shown) between the base of the end cap 2012 and a slot within the end of the flashlight 2010. Other equivalent structures, i.e., inter-engageable screw threads, with a locking device (in the form of a set screw piercing a curved wall of the end cap and engaging a curved wall at the end of the flashlight, not shown) may be used.

Figure 21:
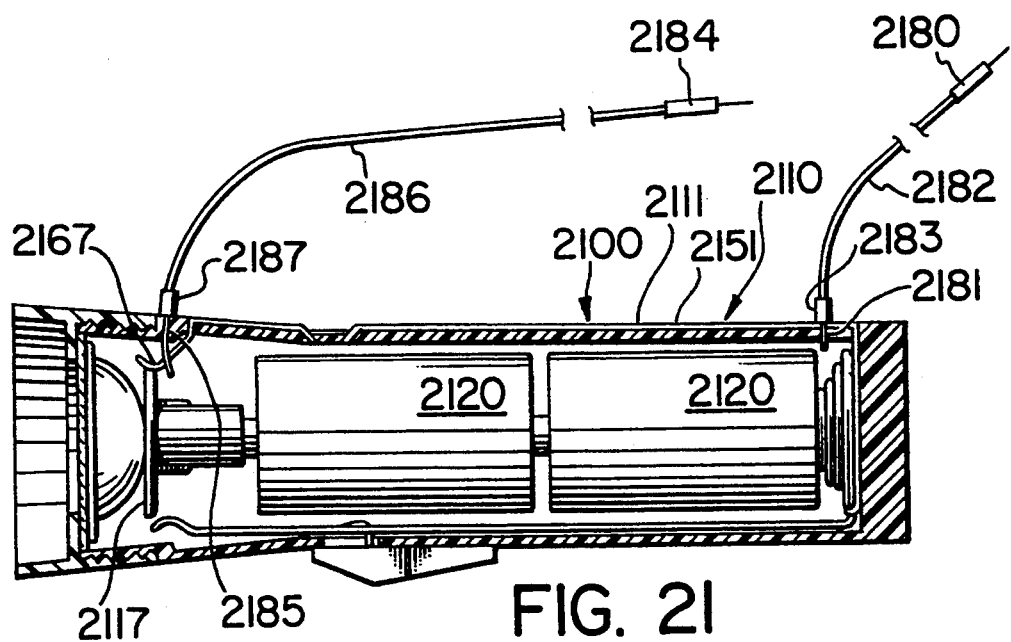
FIG. 21 is a central longitudinal cross-section of a modification of the present invention showing a structure for testing devices other than fuses and light bulbs.

Description of FIG. 21

FIG. 21 shows the flashlight 2100, which is improved according to another embodiment of the present invention. All convention portions of such flashlight 2100, as well as the description of the embodiment of FIGS. 11 and 12 (over which the embodiment to be described herein as a variation of the embodiments in FIGS. 1 and 2) will not be further described. Only the differences will be described.

The variation to be described hereinafter is the provision of clips to enable the electrical continuity testing of electrical components other than fuses and bulbs. Such clips are provided by primary probe 2180 pierced through aperture 2181 piercing through both the rear contact strip 2151 and the body 2111 of the flashlight into the interior of the flashlight 2100 and adjacent contacting an end of battery 2120. Probe 2180 is connected by insulated wire 2182 to contact tip 2183.

This embodiment of the invention also includes a complementary probe 2184 pierced through aperture 2185 piercing both the body 2111 of the flashlight and the internal contact strip 2167 adjacent the electrically-conducting flange 2117. Probe 2184 is connected by insulated wire 2186 to contact tip 2187.

Figure 22:
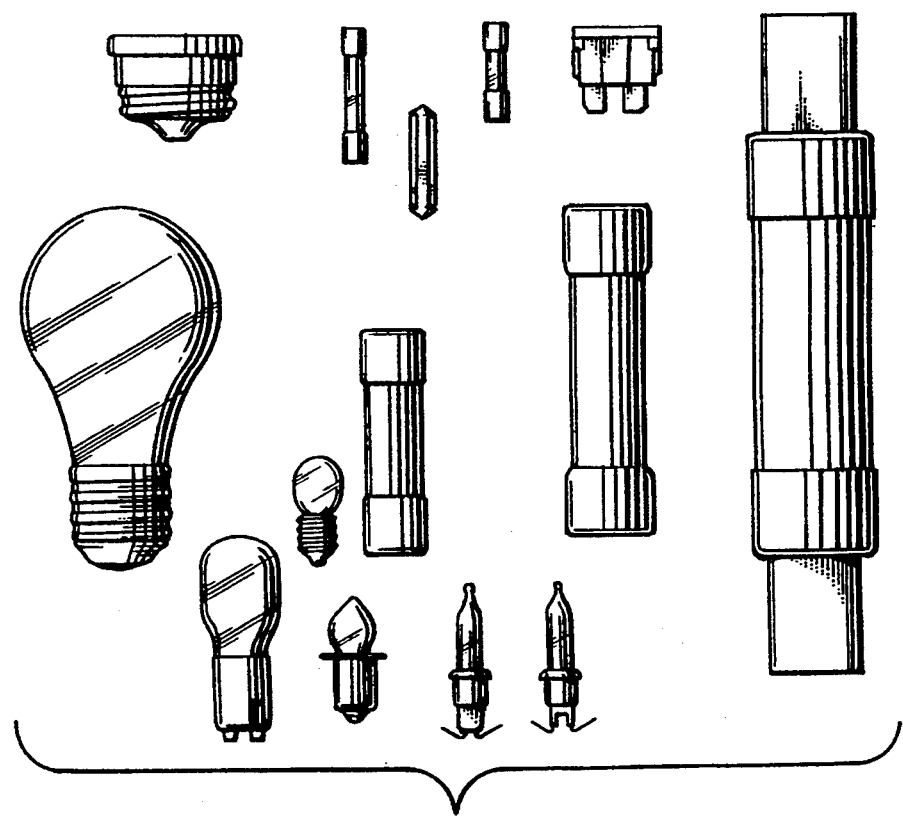
FIG. 22 is a composite view of some of the devices that can be tested using the various embodiments of this invention.

Description of FIG. 22

FIG. 22 merely shows collectively, a representative number of light bulbs and fuses that may be tested using the continuity tester of this invention.

CONCLUSION

The particular continuity tester 1150 shown in FIGS. 11, 12, and 12A is based on the embodiment shown in FIGS. 1, 2 and 2A. However, with suitable modifications, which would be clear to a person skilled in this art, this modification can be used with the embodiments of the continuity tester described in any of FIGS. 3 to 6 and 8 to 10.

The particular continuity tester 1450 shown in FIGS. 14 to 16 is based on the embodiment shown in FIGS. 11, 12 and 12A. However, with suitable modifications, which would be clear to a person skilled in this art, this modification can be applied to the modification of FIGS. 11, 12 and 12A combined with the embodiments of the continuity tester described in any of FIGS. 1 to 6 and 8 to 10.

The particular continuity testers 1750, 1850 and 1950, shown in FIGS. 17, 18, 19 and 19A are based on the embodiment shown in FIGS. 11, 12 and 12A. However, with suitable modifications, which would be clear to a person skilled in this art, these modifications can be applied to the modification of FIGS. 11, 12 and 12A combined with the modifications of FIGS. 14 to 16 and combined with the embodiments of continuity tester described in any of FIGS. 1 to 6 and 8 to 10. While the short circuit preventer has been described as a sliding, electrically non-conductive cover, or strip or cap, it is of course possible to use a hingedly-secured overface plate of electrically non-conductive material.

The particular embodiment shown in FIG. 20 is derived from the embodiment of FIG. 6 and is based on the embodiment of FIGS. 11, 12 and 12A. However, with suitable modifications, which would be clear to a person skilled in this art, this embodiment can be applied to any of the modifications described above.

The testing device shown in FIG. 21 is based on the embodiment of FIGS. 11, 12 and 12A. However, with suitable modifications, which would be clear to a person skilled in this art, these modifications can be applied to the modification of FIGS. 11, 12 and 12A combined with the modifications of FIGS. 14 to 16 and combined with the embodiments of continuity tester described in any of FIGS. 1 to 6 and 8 to 10.

From the foregoing description, one skilled in the art can easily ascertain the essential characteristics of this invention, and without departing from the spirit and scope thereof, can make various changes and modifications of the invention to adapt it to various usages and conditions. Consequently, such changes and modifications are properly, equitably, and "intended" to be, within the full range of equivalence of the following claims.

I claim:

1. An improvement in a flashlight or lantern having a shell providing an insulated hollow body, and a lamp bulb and batteries in a primary series circuit, said improvement being constituted by an electrical continuity tester, said electrical continuity tester comprising a testing series circuit electrically-coupled to said primary series circuit, said testing circuit comprising: a testing site, formed in said shell, said testing site including a pair of converging, sloping, facing walls, separated by a floor, said floor being provided with a pair of spaced-apart channels; an initial component of said testing series circuit in the form of an electrically-conductive strip having a contact portion, said contact portion following the contour and slope of one sloping wall of said testing site, and having one terminating end reposing within one associated said channel, the other end of said initial component being in electrical contact with one end of said primary series circuit; a complementary component of said testing series circuit in the form of an electrically-conductive strip having a contact portion, said contact portion following the contour and slope of said other sloping wall of said testing site, and having one terminating end reposing within the other associated said channel, the other end of said complementary component being in electrical contact with one end of said primary series circuit adjacent said lamp bulb; the size of said testing site, the angle of convergence of said walls, and the spacing of said spaced-apart channels being selected so as to allow said contact portions of said strips which follow said contours and slopes of said sloping walls, to act as guideways to guide terminals of a circuit element being tested into suitable electrical contact.

2. The improvement of claim 1 wherein said one terminating end of said initial component and said one terminating end of said complementary component are each secured within the associated said channels.

3. The improvement of claim 1 wherein said one terminating end of said initial component and said one terminating end of said complementary component are freely disposed at associated said channels and are flexingly disposed adjacent associated sloping walls of said testing site, to be resiliently movingly situated adjacent on associated said channel.

4. The improvement of claim 3 including a raised step on the floor between the two said channels to provide a limit on resilient flexing of said terminating ends.

5. The improvement of claim 1 wherein said strips extend along the longitudinal axis of said body of said flashlight within a longitudinally-extending channel which traverses said testing site, said channel being formed within said body of said flashlight.

6. The improvement of claim 5 wherein said longitudinally-extending channel is a dovetail-in-cross-section channel.

7. The improvement of claim 5 wherein said longitudinally-extending channel is a rectangular-in-cross-section channel.

8. The improvement of claim 1 including a longitudinally-extending platform secured in superposed fashion atop said body of said flashlight, said platform being provided with a longitudinally-extending channel, said longitudinally-extending channel being recessed into said platform, said strips being secured within said longitudinally-extending channel to rest on a lower floor thereof.

9. The improvement of claim 8 wherein said platform is integral with said body of said flashlight.

10. The improvement of claim 8 wherein said longitudinally-extending channel is a dovetail-in-cross-section channel.

11. The improvement of claim 8 wherein said longitudinally-extending channel is a rectangular-in-cross-section channel.

12. The improvement of claim 9 wherein said longitudinally-extending channel is a dovetail-in-cross-section channel.

13. The improvement of claim 9 wherein said longitudinally-extending channel is a rectangular-in-cross-section channel.

14. The improvement of claim 6 including a short-circuit preventer comprising a cover, strip or cap which is slidably engaged within said longitudinally-extending channel, said cover, strip or cap having a base whose cross-section is complementary with the cross-section of the channel within which it is slidable, and an upper grippable surface.

15. The improvement of claim 14 wherein said channel is dovetail-in-cross-section, and wherein said base includes an outwardly flared tenon complementary with said dovetail.

16. The improvement of claim 8 including a short-circuit preventer comprising a cover, strip or cap which is slidably engaged within said longitudinally-extending channel, said cover, strip or cap having a base whose cross-section is complementary with the cross-section of the channel within which it is slidable, and an upper grippable surface.

17. The improvement of claim 16 wherein said channel is rectangular in cross-section with an inlet throat and wherein said base includes lateral legs complementary to the cross-section of the channel.

18. The improvement of claim 16 wherein said channel is retangular in cross-section and having a throat defined by a pair of facing arcuate wells, and wherein said base has a "T" shaped cross-section complementary to the cross-section of the channel.

19. The improvement of claim 6 including a short-circuit preventer comprising a cover, strip or cap which is slidably engaged within said longitudinally-extending channel, said cover, strip or cap having a base whose cross-section is complementary with the cross-section of the channel within which it is slidable said base also including an inset, longitudinally-extending electrically-conductive strip, and an upper grippable surface.

20. The improvement of claim 19 wherein said channel is dovetail-in-cross-section, and wherein said base includes an outwardly flared tenor complementary with said dovetail.

21. The improvement of claim 1 including a fuse-gripping well integral with or disconnectedly attached to, said cylindrical end of said flashlight.

22. The improvement of claim 1 including an auxiliary testing device comprising a first probe engaged with said other end of said initial component and an electrical contact with a battery, and a second probe in electrical contact with said other end of said complementary component.

* * * * *